US012713983B2

(12) United States Patent
Uzoh et al.

(10) Patent No.: US 12,713,983 B2
(45) Date of Patent: Aug. 18, 2026

(54) BONDED STRUCTURES

(71) Applicant: ADEIA SEMICONDUCTOR BONDING TECHNOLOGIES INC., San Jose, CA (US)

(72) Inventors: Cyprian Emeka Uzoh, San Jose, CA (US); Rajesh Katkar, Milpitas, CA (US); Thomas Workman, San Jose, CA (US); Gaius Gillman Fountain, Jr., Youngsville, NC (US); Guilian Gao, San Jose, CA (US); Jeremy Alfred Theil, Mountain View, CA (US); Gabriel Z. Guevara, San Jose, CA (US); Kyong-Mo Bang, Fremont, CA (US); Laura Wills Mirkarimi, Sunol, CA (US)

(73) Assignee: Adeia Semiconductor Bonding Technologies Inc., San Jose, CA (US)

( * ) Notice: Subject to any disclaimer, the term of this patent is extended or adjusted under 35 U.S.C. 154(b) by 385 days.

(21) Appl. No.: 18/173,690

(22) Filed: Feb. 23, 2023

(65) Prior Publication Data

US 2023/0268300 A1 Aug. 24, 2023

Related U.S. Application Data

(60) Provisional application No. 63/313,639, filed on Feb. 24, 2022.

(51) Int. Cl.
*H01L 23/48* (2006.01)
*H01L 23/52* (2006.01)
(Continued)

(52) U.S. Cl.
CPC ........... *H10W 90/00* (2026.01); *H10W 20/20* (2026.01); *H10W 70/65* (2026.01); *H10W 72/01* (2026.01);
(Continued)

(58) Field of Classification Search
CPC . H01L 24/08; H01L 23/481; H01L 23/49838; H01L 25/0652; H01L 25/0655;
(Continued)

(56) References Cited

U.S. PATENT DOCUMENTS 5,753,536 A 5/1998 Sugiyama et al.
5,771,555 A 6/1998 Eda et al.
(Continued)

FOREIGN PATENT DOCUMENTS

CN 111916354 A * 11/2020 .......... H10W 70/685
CN 112687671 A 4/2021
(Continued)

OTHER PUBLICATIONS

International Search Report and Written Opinion mailed Jun. 22, 2023, International Application No. PCT/US2023/063147, 17 pages.
(Continued)

*Primary Examiner* — Niki H Nguyen
(74) *Attorney, Agent, or Firm* — Knobbe, Martens, Olson & Bear, LLP

(57) ABSTRACT

A bonded structure can include a carrier including a first conductive contact and a second conductive contact, a first singulated element including a third conductive contact directly bonded to the first conductive contact without an adhesive, and a second singulated element including a fourth conductive contact directly bonded to the second conductive contact without an adhesive, wherein the first and second conductive contacts are spaced apart by a contact spacing of no more than 250 microns.

19 Claims, 10 Drawing Sheets

(51) Int. Cl.

| | |
|---|---|
| ***H10W 20/20*** | (2026.01) |
| ***H10W 70/65*** | (2026.01) |
| ***H10W 90/00*** | (2026.01) |
| *H10W 72/00* | (2026.01) |
| *H10W 74/00* | (2026.01) |
| *H10W 74/10* | (2026.01) |
| *H10W 80/00* | (2026.01) |
| *H10W 90/20* | (2026.01) |

(52) U.S. Cl.
CPC ............ *H10W 74/00* (2026.01); *H10W 74/10* (2026.01); *H10W 80/312* (2026.01); *H10W 80/327* (2026.01); *H10W 80/701* (2026.01); *H10W 90/20* (2026.01); *H10W 90/792* (2026.01); *H10W 90/794* (2026.01)

(58) Field of Classification Search
CPC ..... H01L 25/0657; H01L 25/16; H01L 24/80; H01L 2224/08121; H01L 2224/08145; H01L 2224/08225; H01L 2224/80895; H01L 2224/80896; H01L 2225/06524; H01L 2225/06527; H01L 2924/1011; H01L 2924/1815; H01L 2924/182; H01L 2224/32145; H01L 2224/16145; H01L 2224/73204; H01L 24/81; H01L 2924/15311; H01L 24/05; H01L 21/76805; H01L 2224/0401; H01L 2224/16227; H01L 2224/16146; H01L 23/49816; H01L 2225/06565; H01L 24/19; H01L 2224/12105; H01L 23/5386; H01L 21/76897; H01L 2225/06517; H01L 24/06; H01L 2225/1058; H01L 2224/24145; H01L 2224/80357; H01L 24/75; H01L 2224/08146; H01L 2224/48145; H01L 2224/81; H01L 2224/16148; H01L 2224/838; H01L 2224/05; H01L 2224/24105; H01L 2224/08148; H01L 2224/08137; H01L 2224/25174; H01L 2224/4824; H01L 2224/32227; H01L 2224/73203; H01L 2224/16221; H01L 2224/80894; H01L 25/071; H01L 2224/1703; H01L 2225/06541; H01L 2224/48465; H01L 2225/06513; H01L 25/0753; H01L 24/13; H01L 2224/04105; H01L 2224/81203; H01L 2224/0603; H01L 23/488; H01L 2224/48472; H01L 2924/20752; H01L 2924/2076; H01L 2924/15331
See application file for complete search history.

(56) References Cited

U.S. PATENT DOCUMENTS 6,080,640 A 6/2000 Gardner et al.
6,423,640 B1 7/2002 Lee et al.
6,465,892 B1 10/2002 Suga
6,887,769 B2 5/2005 Kellar et al.
6,908,027 B2 6/2005 Tolchinsky et al.
7,045,453 B2 5/2006 Canaperi et al.
7,105,980 B2 9/2006 Abbott et al.
7,193,423 B1 3/2007 Dalton et al.
7,750,488 B2 7/2010 Patti et al.
7,803,693 B2 9/2010 Trezza
8,183,127 B2 5/2012 Patti et al.
8,349,635 B1 1/2013 Gan et al.
8,377,798 B2 2/2013 Peng et al.
8,441,131 B2 5/2013 Ryan
8,476,165 B2 7/2013 Trickett et al.
8,482,132 B2 7/2013 Yang et al.
8,501,537 B2 8/2013 Sadaka et al.
8,524,533 B2 9/2013 Tong et al.
8,620,164 B2 12/2013 Heck et al.
8,647,987 B2 2/2014 Yang et al.
8,697,493 B2 4/2014 Sadaka
8,716,105 B2 5/2014 Sadaka et al.
8,802,538 B1 8/2014 Liu
8,809,123 B2 8/2014 Liu et al.
8,841,002 B2 9/2014 Tong
9,093,350 B2 7/2015 Endo et al.
9,142,517 B2 9/2015 Liu et al.
9,171,756 B2 10/2015 Enquist et al.
9,184,125 B2 11/2015 Enquist et al.
9,224,704 B2 12/2015 Landru
9,230,941 B2 1/2016 Chen et al.
9,257,399 B2 2/2016 Kuang et al.
9,299,736 B2 3/2016 Chen et al.
9,312,229 B2 4/2016 Chen et al.
9,331,149 B2 5/2016 Tong et al.
9,337,235 B2 5/2016 Chen et al.
9,385,024 B2 7/2016 Tong et al.
9,394,161 B2 7/2016 Cheng et al.
9,431,368 B2 8/2016 Enquist et al.
9,437,572 B2 9/2016 Chen et al.
9,443,796 B2 9/2016 Chou et al.
9,461,007 B2 10/2016 Chun et al.
9,496,239 B1 11/2016 Edelstein et al.
9,536,848 B2 1/2017 England et al.
9,559,081 B1 1/2017 Lai et al.
9,620,481 B2 4/2017 Edelstein et al.
9,656,852 B2 5/2017 Cheng et al.
9,723,716 B2 8/2017 Meinhold
9,728,521 B2 8/2017 Tsai et al.
9,741,620 B2 8/2017 Uzoh et al.
9,799,587 B2 10/2017 Fujii et al.
9,852,988 B2 12/2017 Enquist et al.
9,893,004 B2 2/2018 Yazdani
9,899,442 B2 2/2018 Katkar
9,929,050 B2 3/2018 Lin
9,941,241 B2 4/2018 Edelstein et al.
9,941,243 B2 4/2018 Kim et al.
9,953,941 B2 4/2018 Enquist
9,960,142 B2 5/2018 Chen et al.
10,002,844 B1 6/2018 Wang et al.
10,026,605 B2 7/2018 Doub et al.
10,075,657 B2 9/2018 Fahim et al.
10,204,893 B2 2/2019 Uzoh et al.
10,269,756 B2 4/2019 Uzoh
10,276,619 B2 4/2019 Kao et al.
10,276,909 B2 4/2019 Huang et al.
10,418,277 B2 9/2019 Cheng et al.
10,446,456 B2 10/2019 Shen et al.
10,446,487 B2 10/2019 Huang et al.
10,446,532 B2 10/2019 Uzoh et al.
10,508,030 B2 12/2019 Katkar et al.
10,522,499 B2 12/2019 Enquist et al.
10,707,087 B2 7/2020 Uzoh et al.
10,784,191 B2 9/2020 Huang et al.
10,790,262 B2 9/2020 Uzoh et al.
10,840,135 B2 11/2020 Uzoh
10,840,205 B2 11/2020 Fountain, Jr. et al.
10,854,578 B2 12/2020 Morein
10,879,212 B2 12/2020 Uzoh et al.
10,886,177 B2 1/2021 DeLaCruz et al.
10,892,246 B2 1/2021 Uzoh
10,923,408 B2 2/2021 Huang et al.
10,923,413 B2 2/2021 DeLaCruz
10,950,547 B2 3/2021 Mohammed et al.
10,964,664 B2 3/2021 Mandalapu et al.
10,985,133 B2 4/2021 Uzoh
10,991,804 B2 4/2021 DeLaCruz et al.
10,998,292 B2 5/2021 Lee et al.
11,004,757 B2 5/2021 Katkar et al.
11,011,494 B2 5/2021 Gao et al.
11,011,503 B2 5/2021 Wang et al.
11,031,285 B2 6/2021 Katkar et al.
11,037,919 B2 6/2021 Uzoh et al.
11,056,348 B2 7/2021 Theil

(56) References Cited

U.S. PATENT DOCUMENTS 11,069,734 B2 7/2021 Katkar
11,088,099 B2 8/2021 Katkar et al.
11,127,738 B2 9/2021 DeLaCruz et al.
11,158,573 B2 10/2021 Uzoh et al.
11,158,606 B2 10/2021 Gao et al.
11,169,326 B2 11/2021 Huang et al.
11,171,117 B2 11/2021 Gao et al.
11,176,450 B2 11/2021 Teig et al.
11,195,748 B2 12/2021 Uzoh et al.
11,205,625 B2 12/2021 DeLaCruz et al.
11,244,920 B2 2/2022 Uzoh
11,256,004 B2 2/2022 Haba et al.
11,264,357 B1 3/2022 DeLaCruz et al.
11,276,676 B2 3/2022 Enquist et al.
11,296,044 B2 4/2022 Gao et al.
11,296,053 B2 4/2022 Uzoh et al.
11,329,034 B2 5/2022 Tao et al.
11,348,898 B2 5/2022 DeLaCruz et al.
11,355,404 B2 6/2022 Gao et al.
11,355,443 B2 6/2022 Huang et al.
11,367,652 B2 6/2022 Uzoh et al.
11,373,963 B2 6/2022 DeLaCruz et al.
11,380,597 B2 7/2022 Katkar et al.
11,385,278 B2 7/2022 DeLaCruz et al.
11,387,202 B2 7/2022 Haba et al.
11,387,214 B2 7/2022 Wang et al.
11,393,779 B2 7/2022 Gao et al.
11,462,419 B2 10/2022 Haba
11,476,213 B2 10/2022 Haba et al.
11,515,291 B2 11/2022 DeLaCruz et al.
11,626,363 B2 4/2023 Haba et al.
11,631,647 B2 4/2023 Haba
2003/0155640 A1 8/2003 Yan et al.
2004/0084414 A1 5/2004 Sakai et al.
2006/0057945 A1 3/2006 Hsu et al.
2007/0111386 A1 5/2007 Kim et al.
2014/0038357 A1 2/2014 Arnold et al.
2014/0175655 A1 6/2014 Chen et al.
2015/0064498 A1 3/2015 Tong
2016/0343682 A1 11/2016 Kawasaki
2018/0175012 A1 6/2018 Wu et al.
2018/0182639 A1 6/2018 Uzoh et al.
2018/0182666 A1 6/2018 Uzoh et al.
2018/0190583 A1 7/2018 DeLaCruz et al.
2018/0219038 A1 8/2018 Gambino et al.
2018/0323177 A1 11/2018 Yu et al.
2018/0323227 A1 11/2018 Zhang et al.
2018/0331066 A1 11/2018 Uzoh et al.
2019/0067104 A1 2/2019 Huang et al.
2019/0115277 A1 4/2019 Yu et al.
2019/0131277 A1 5/2019 Yang et al.
2019/0385935 A1 12/2019 Gao et al.
2020/0013765 A1 1/2020 Fountain, Jr. et al.
2020/0035641 A1 1/2020 Fountain, Jr. et al.
2020/0294908 A1 9/2020 Haba et al.
2020/0294920 A1* 9/2020 Hariri .................. H10W 70/65
2020/0328162 A1 10/2020 Haba et al.
2020/0395309 A1 12/2020 Cheah et al.
2020/0395321 A1 12/2020 Katkar et al.
2021/0098412 A1 4/2021 Haba et al.
2021/0118864 A1 4/2021 DeLaCruz et al.
2021/0143125 A1 5/2021 DeLaCruz et al.
2021/0181510 A1 6/2021 Katkar et al.
2021/0193603 A1 6/2021 DeLaCruz et al.
2021/0193624 A1 6/2021 DeLaCruz et al.
2021/0193625 A1 6/2021 Katkar et al.
2021/0242152 A1 8/2021 Fountain, Jr. et al.
2021/0296282 A1 9/2021 Gao et al.
2021/0305202 A1 9/2021 Uzoh et al.
2021/0366820 A1 11/2021 Uzoh
2021/0375826 A1 12/2021 Chen et al.
2021/0375850 A1 12/2021 Uzoh et al.
2021/0407941 A1 12/2021 Haba
2022/0077063 A1 3/2022 Haba
2022/0077087 A1 3/2022 Haba
2022/0139867 A1 5/2022 Uzoh
2022/0139869 A1 5/2022 Gao et al.
2022/0189850 A1* 6/2022 Liff .................... H10W 40/253
2022/0208650 A1 6/2022 Gao et al.
2022/0208702 A1 6/2022 Uzoh
2022/0208723 A1 6/2022 Katkar et al.
2022/0246497 A1 8/2022 Fountain, Jr. et al.
2022/0285303 A1 9/2022 Mirkarimi et al.
2022/0319901 A1 10/2022 Suwito et al.
2022/0320035 A1 10/2022 Uzoh et al.
2022/0320036 A1 10/2022 Gao et al.
2022/0328467 A1* 10/2022 Chen .................... H10W 90/00
2023/0005850 A1 1/2023 Fountain, Jr.
2023/0019869 A1 1/2023 Mirkarimi et al.
2023/0036441 A1 2/2023 Haba et al.
2023/0067677 A1 3/2023 Lee et al.
2023/0069183 A1 3/2023 Haba
2023/0100032 A1 3/2023 Haba et al.
2023/0115122 A1 4/2023 Uzoh et al.
2023/0122531 A1 4/2023 Uzoh
2023/0123423 A1 4/2023 Gao et al.
2023/0125395 A1 4/2023 Gao et al.
2023/0130259 A1 4/2023 Haba et al.
2023/0132632 A1 5/2023 Katkar et al.
2023/0140107 A1 5/2023 Uzoh et al.
2023/0142680 A1 5/2023 Guevara et al.
2023/0154816 A1 5/2023 Haba et al.
2023/0154828 A1 5/2023 Haba et al.
2023/0187264 A1 6/2023 Uzoh et al.
2023/0187317 A1 6/2023 Uzoh
2023/0187412 A1 6/2023 Gao et al.
2023/0197453 A1 6/2023 Fountain, Jr. et al.
2023/0197496 A1 6/2023 Theil
2023/0197559 A1 6/2023 Haba et al.
2023/0197560 A1 6/2023 Katkar et al.
2023/0197655 A1 6/2023 Theil et al.
2023/0207402 A1 6/2023 Fountain, Jr. et al.
2023/0207437 A1 6/2023 Haba
2023/0207474 A1 6/2023 Uzoh et al.
2023/0207514 A1 6/2023 Gao et al.

FOREIGN PATENT DOCUMENTS

JP 2013-033786 A 2/2013
JP 2018-160519 10/2018
WO WO 2005/043584 A2 5/2005

OTHER PUBLICATIONS

Ker, Ming-Dou et al., “Fully process-compatible layout design on bond pad to improve wire bond reliability in CMOS Ics,” IEEE Transactions on Components and Packaging Technologies, Jun. 2002, vol. 25, No. 2, pp. 309-316.
Moriceau, H. et al., “Overview of recent direct wafer bonding advances and applications,” Advances in Natural Sciences-Nanoscience and Nanotechnology, 2010, 11 pages.
Nakanishi, H. et al., “Studies on SiO2—SiO2 bonding with hydrofluoric acid. Room temperature and low stress bonding technique for MEMS,” Sensors and Actuators, 2000, vol. 79, pp. 237-244.
Oberhammer, J. et al., “Sealing of adhesive bonded devices on wafer level,” Sensors and Actuators A, 2004, vol. 110, No. 1-3, pp. 407-412, see pp. 407-412, and Figures 1 (a)-1 (I), 6 pages.
Plobi, A. et al., “Wafer direct bonding: tailoring adhesion between brittle materials,” Materials Science and Engineering Review Journal, 1999, R25, 88 pages.
European Extended Search Report, re EP Application No. 23760929.2, dated Feb. 3, 2026.

* cited by examiner 107
107
103
106
101
105

201
209
210
212
211
208

201
213
210
211
214

201
210
215
215
211
213

202
214
201
210
211
203
214

202
201
210
211

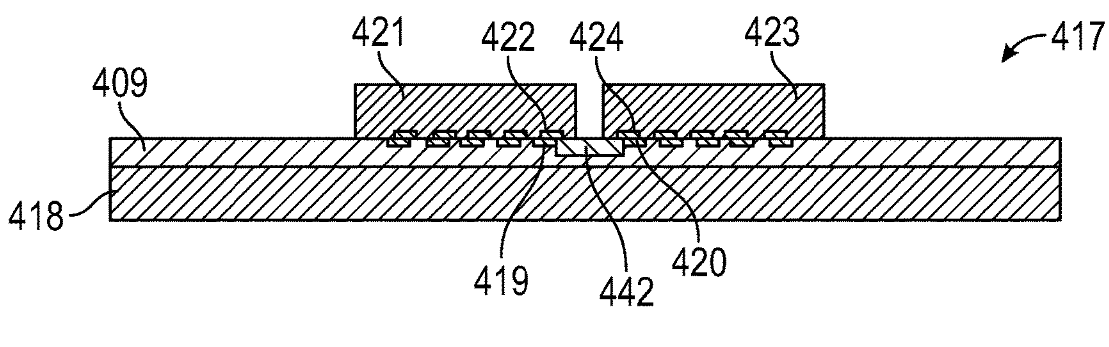
FIG. 4K
549b
544
548b
509b
546b
ρ
550a
547a
547b
550b
509a
546a
543
548a
549a
FIG. 5A
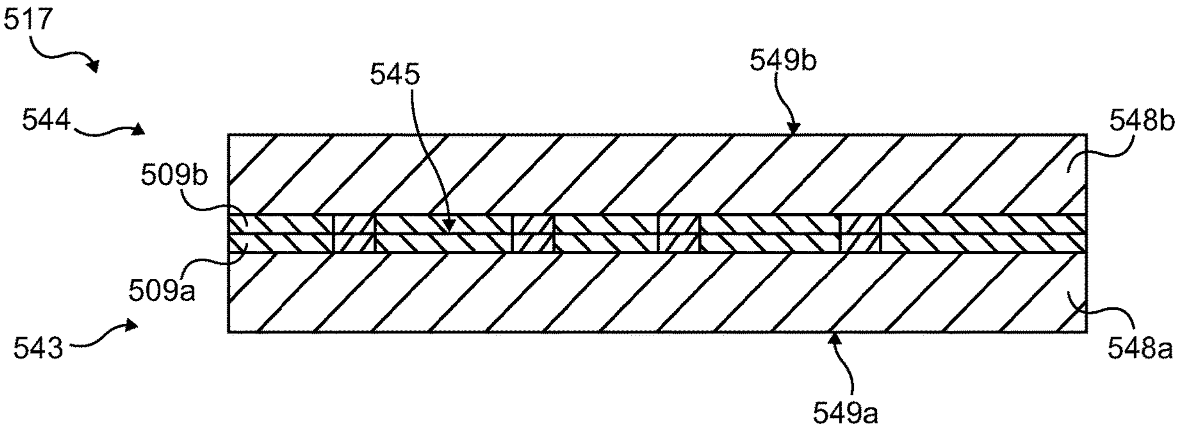
FIG. 5B

BONDED STRUCTURES

CROSS REFERENCE TO RELATED APPLICATIONS

This application claims benefit of priority to U.S. Provisional Patent Application No. 63/313,639, filed Feb. 24, 2022, titled "BONDED STRUCTURES," the contents of which are hereby incorporated by reference in their entirety.

BACKGROUND

Field

The field relates to bonded structures, and, in particular, to bonded structures with increased area efficiency of circuitry and contacts.

Description of the Related Art

Semiconductor elements, such as semiconductor wafers or integrated device dies, can be stacked and directly bonded to one another without an adhesive. For example, nonconductive (dielectric or semiconductor) surfaces can be made extremely smooth and treated to enhance direct, covalent bonding, at room temperature and without application of pressure beyond contact. In some hybrid direct bonded structures, nonconductive field regions of the elements can be directly bonded to one another, and corresponding conductive contact structures can be directly bonded to one another.

BRIEF DESCRIPTION OF THE DRAWINGS

FIGS. 4A-4K show various embodiments of bonding structures.

FIGS. 5A-5B illustrate a process for forming a directly hybrid bonded structure without an intervening adhesive according to some embodiments.

DETAILED DESCRIPTION

For many years a trend had developed for integrating more and more functions on a chip to form systems-on-chip (SoC). More recently a trend has been to disaggregate circuitry into several chips and reassemble them in packaging processes. Advantages of such disaggregation include the ability to use different technologies for different chips or chiplets, which can be less expensive for some of the circuits, and the production of more chips or chiplets from a wafer compared to very large SoC chips, resulting in greater yield for a given level of contamination.

Figures 1A, 1B:
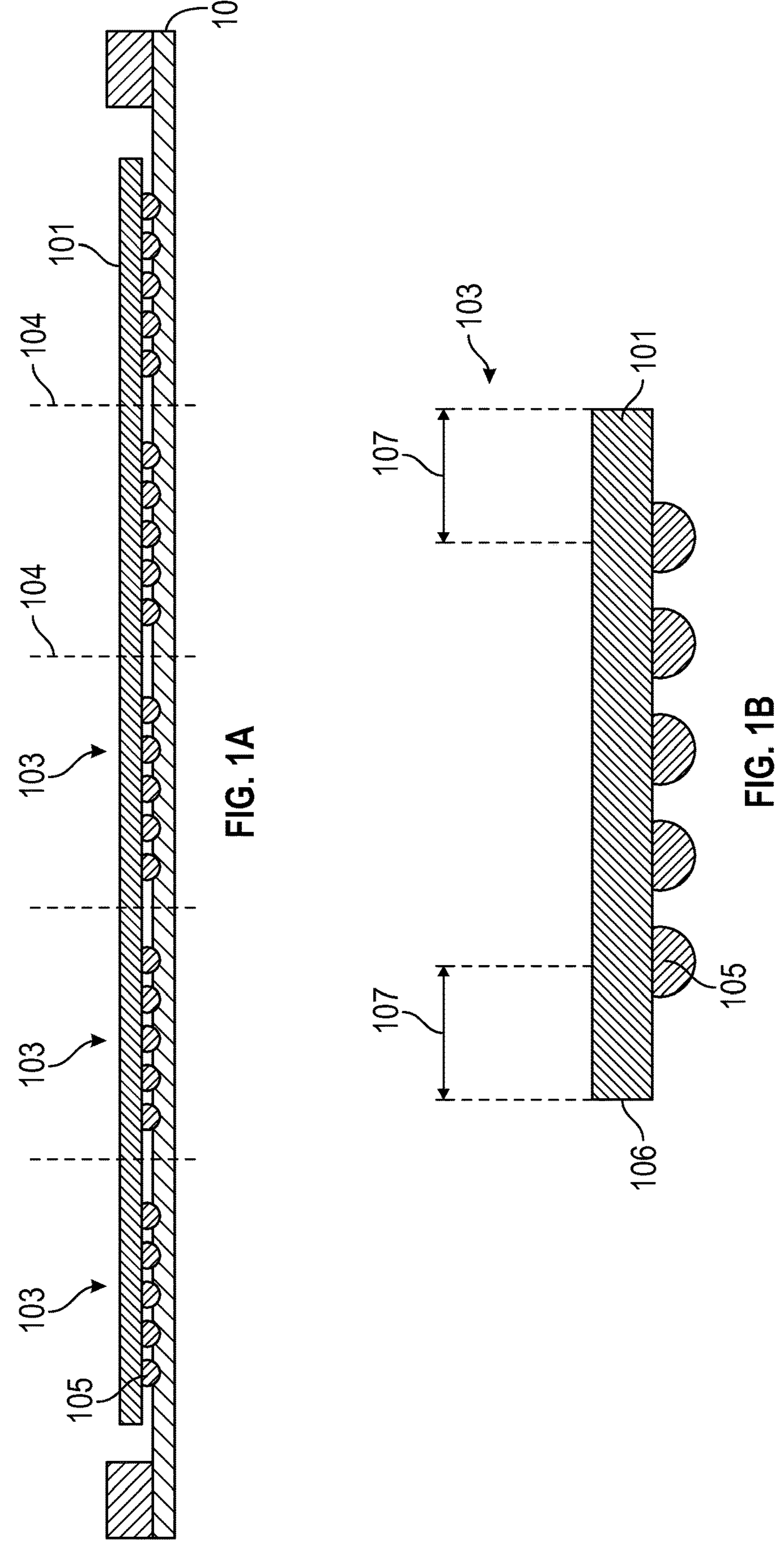
FIG. 1A shows a conventional method for singulating a wafer.
FIGS. 1B-1D show varying sizes of dies with edge exclusions from conventional methods.

As shown in FIG. 1A, a substrate 101 (e.g., wafer) is provided on a dicing frame 102, and singulated into a plurality of singulated elements 103 divided at the saw streets 104. Conventional technology for device manufacture and assembly places limitations on the density of circuitry in the overall system, particularly where functions are disaggregated into multiple elements and aggregated by packaging. For example, vertical connections between stacked elements, such as copper pillars or solder balls 105, require some minimal spacing between pads, or spreading out the contacts by a redistribution layers (RDL). Such minimal spacing is exacerbated at the edges of laterally adjacent devices due to conventional exclusion zones at the device perimeters, due in part to the use of saws for singulation of chips from wafers. For example, conventional exclusion zones are utilized to space active regions and/or pads of the die from saw streets so as to reduce or minimize damage that may occur during the dicing or singulation process. Pick-and-place and/or bonding tools having limited alignment accuracy can also place limitations on the density of devices in the assembly. Substructural damage imparted to the devices near the die edge may reduce device yield. Conventional exclusion zones around the perimeters of chips represent lost real estate for active circuitry. If any interconnects or contact pads are provided in the exclusion zone, they are typically electrically inactive or "dummy" contact pads. Accordingly, electrically active pads (e.g., pads that electrically connect to circuitry in the die, such as to a signal line, a power line, or ground) are spaced inwardly from the die edge by an exclusion zone.

Figures 1C, 1D:
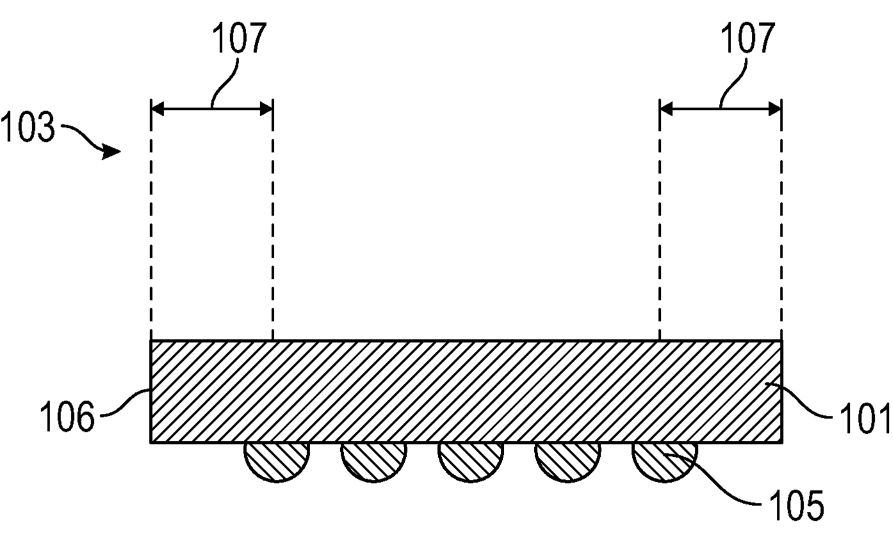

FIGS. 1B-1D show singulated elements of various sizes. Each singulated element 103 may comprise a substrate 101 and solder balls 105 as described in connection with FIG. 1A. As shown in FIGS. 1B-1D, electrically active bond pads may be spaced from the die edge 106 by an edge exclusion distance 107, which represents unused real estate of the die. The edge exclusion distance 107 (and edge exclusion area) increases significantly with decreasing die size, such that, for small dies (e.g., dies with maximum widths less than 4 mm, less than 3 mm, or less than 2 mm), the edge exclusion distance occupies a relatively large proportion of the die. The increased exclusion distance 107 therefore reduces the useful area for devices in the die. For structures in which the dies are solder bonded to the carrier, the exclusion distance 107 is substantial, due to the large pitches between adjacent pads that are used to prevent solder bridging that would occur at finer pitches. Large edge exclusion zones reduce design flexibility for functional pad (input/output, or I/O) counts for a given die, and also increase distances for electrical connections among elements (such as passive components, chips or chiplets) in a system, resulting in degradation in the performance of the chip or chiplet. By way of example, a typical edge exclusion is approximately 200 μm using traditional methods for singulating dies. In one example, an 8 mm×12 mm die with a 200 μm edge exclusion distance results in about 8.2% of the die area that is unused. In another example, a 4 mm×4 mm die with a 200 μm edge exclusion distance results in about 19% of the die area that is unused. In another example, a 1 mm×1 mm die with a 200 μm edge exclusion distance results in about 64% of the die area that is unused. Accordingly, there remains a continuing need to reducing the exclusion area in small dies to increase die design flexibility, the portion of the chip or chiplet designed for active or passive circuitry and afford higher functional I/O counts.

Figures 2A, 2B, 2C:
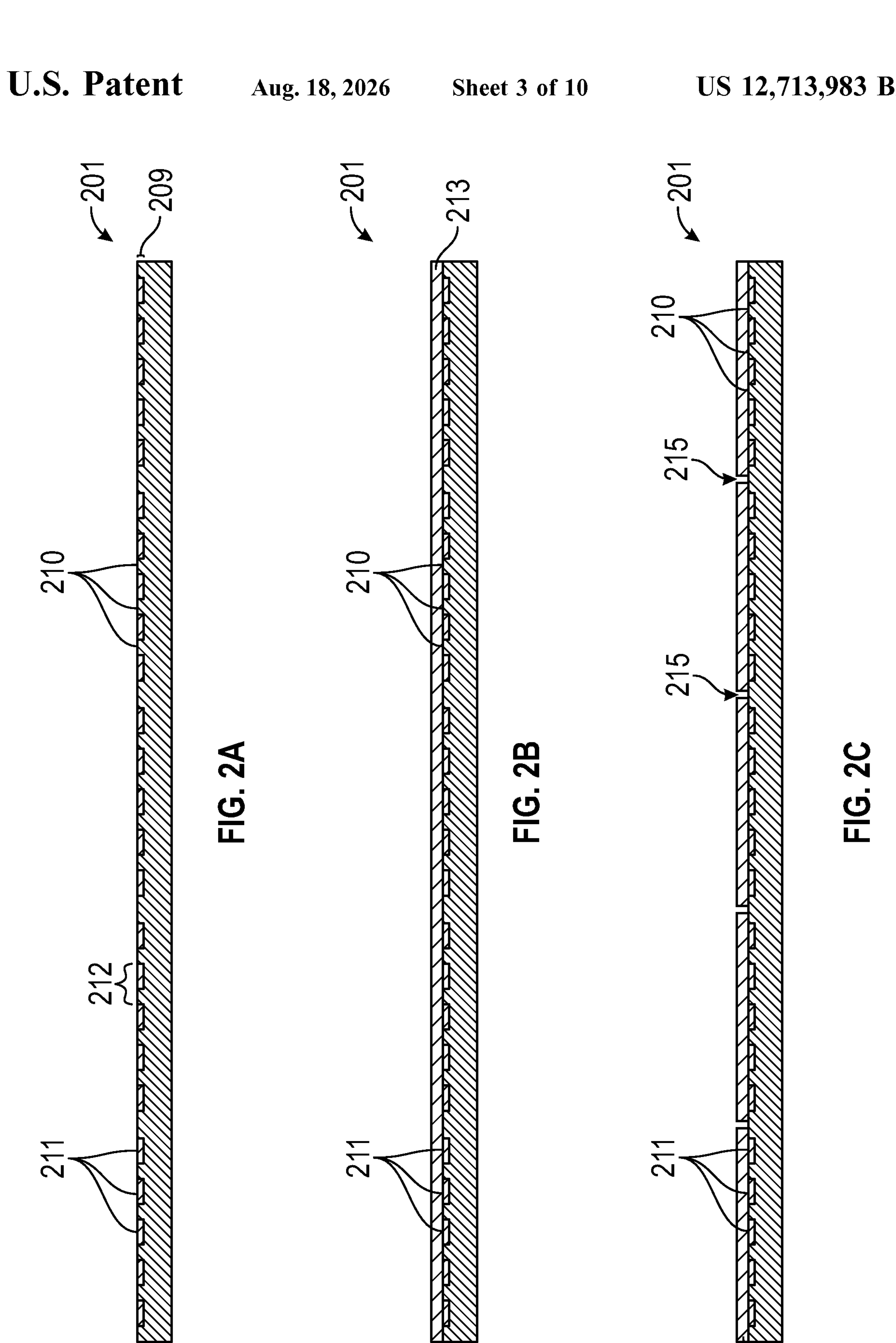
FIGS. 2A-2H show a method for forming a die with reduced edge exclusion zones, according to various embodiments.
Figures 2D, 2E, 2F:
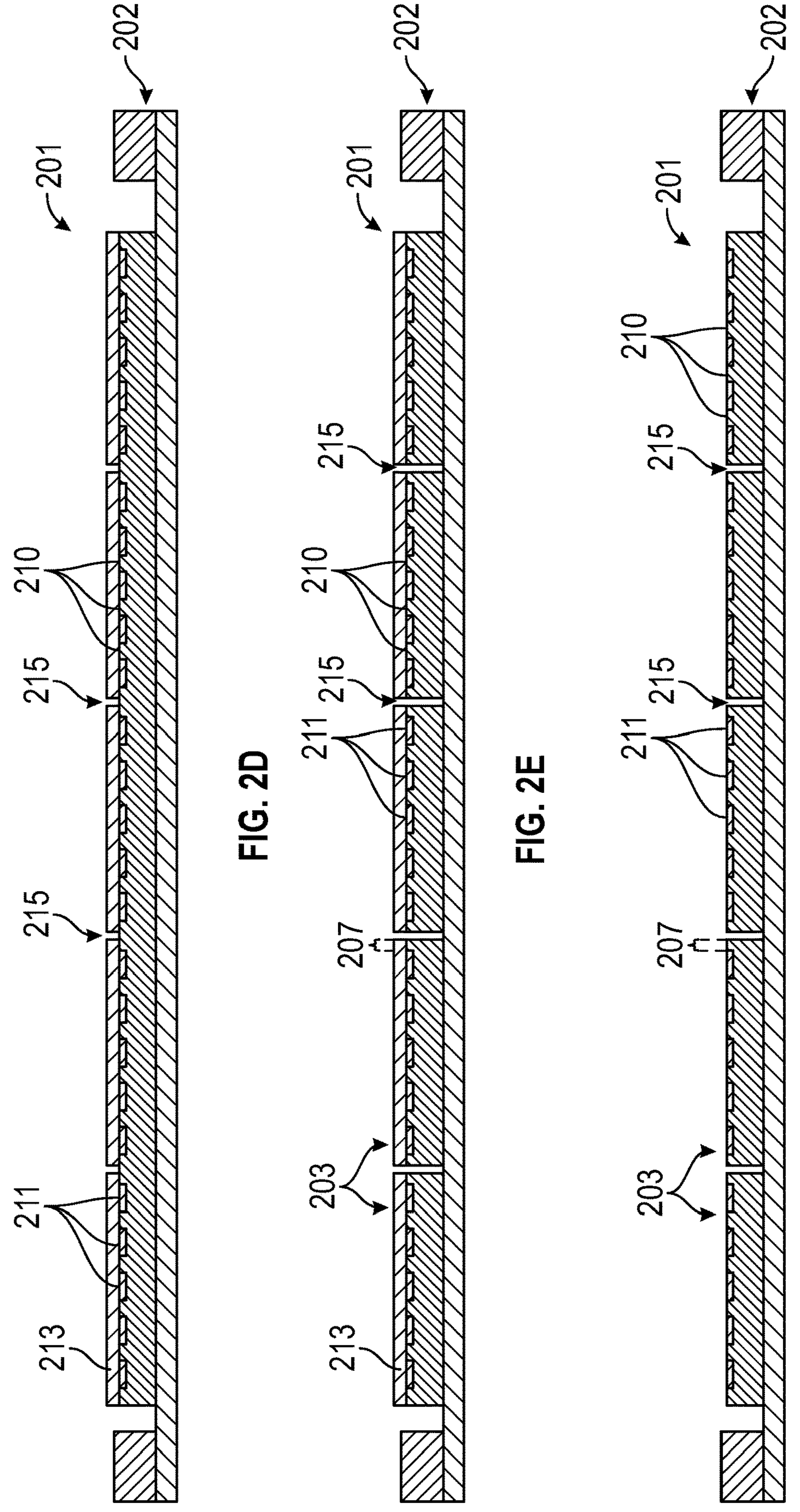
Figures 2G, 2H:
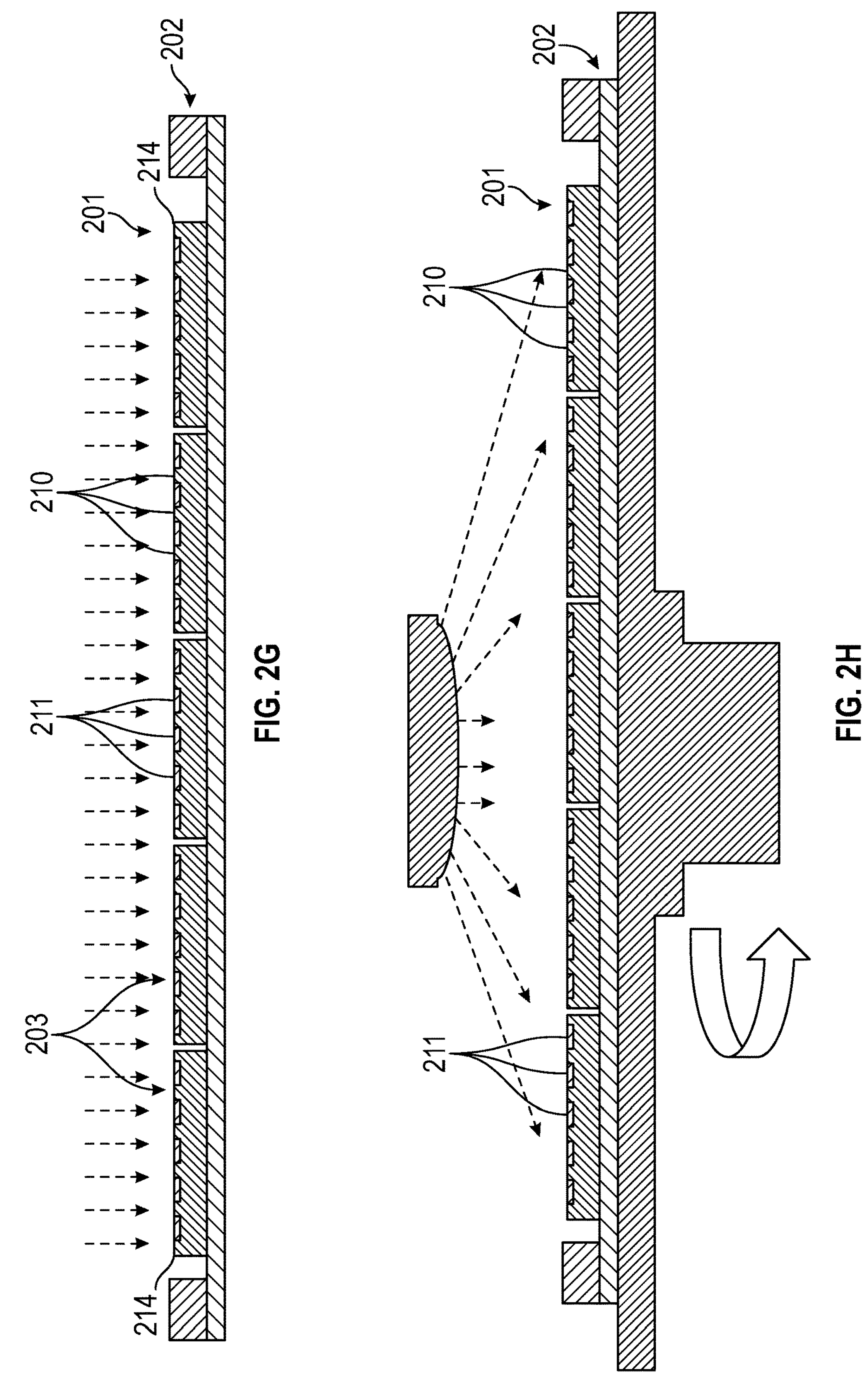

FIGS. 2A-2H illustrate an example process for forming singulated elements configured for direct hybrid bonding, according to various embodiments. As shown in FIG. 2A, a substrate 201 (e.g., a wafer) can include a bulk portion 208, and a bonding layer 209 over the bulk portion 208. The bonding layer 209 may comprise a dielectric material with at least partially embedded conductive contact features. The bonding layer 209 can include a plurality of nonconductive regions 210 and a plurality of conductive contacts 211 at least partially embedded in the bonding layer 209. Beneficially, when configured for direct hybrid bonding, the contacts 211 can be provided at a pitch 212 significantly smaller than pitches used in solder bonding. The substrate 201 can be planarized in FIG. 2A. In some embodiments, the substate is planarized through chemical mechanical polishing (CMP). In FIG. 2B, a protective layer 213 (such as a photoresist) can be provided over the substrate 201. In some embodiments, the planarized surface 214 can have conductive contacts 211 recessed by a small amount (for example, less than 20 nm, less than 10 nm, or even less than 5 nm) below the surrounding nonconductive field regions 210. The protective layer 213 can be patterned to include recesses 215 in the protective layer in FIG. 2C, and the substrate 201 can be transferred to a dicing frame 202 in FIG. 2D. In FIG. 2E, the substrate 201 can be singulated into a plurality of singulated elements 203. In the illustrated embodiment, the substrate 201 is singulated using an etching process, e.g., a reactive ion etching (RIE) or plasma dicing process. Beneficially, compared to saw singulation, the RIE singulation process of the illustrated embodiments entails reduced damage to the edges of the dies, which can reduce defects at the edges and allow a smaller exclusion distance 207. In some embodiments, RIE singulation can result in an edge exclusion distance 207 of less than 40μ, less than 20 μm, less than 15 μm, or less than 10 μm. In FIG. 2F, the protective layer 213 can be removed, and in FIG. 2G, the bonding surfaces 214 can be processed, such as by ashing (e.g., to remove debris from the protective layer), cleaning and/or a surface activation treatment (e.g., nitrogen plasma treatment). In FIG. 2H, the singulated dies 203 can be cleaned, rinsed, dried and prepared for direct bonding to another element, such as a carrier. In some embodiments, the patterned substrate 201 of FIG. 2C may be singulated by a combination of dry etch, (e.g., RIE), wet etchant, and a fine dicing blade. For example, RIE may be applied to remove dielectric material in the region below gaps in the resist mask. After dry etching, a suitable wet etchant may be employed to remove exposed conductive material. The remaining substrate (for example, bulk semiconductor material) may be cut by a fine dicing blade, laser dicing or by dry etch to complete the singulation.

In some embodiments, the sides of the singulated dies may be further processed. In some embodiments the side edges of the singulated dies may have etched surfaces (e.g., surfaces without burrs or debris from saw singulation). The etched surfaces may include a pattern indicative of an etch process (e.g., an RIE or wet etch process). In some embodiments the sidewalls may be slightly tapered. For example, the sidewalls may have an angle between 85° and 90° relative to the horizontal. In some embodiments, the sidewalls are substantially vertical. Limiting the taper of the sidewalls can be beneficial so as to allow the singulated dies to be brought closer together.

Figure 3:
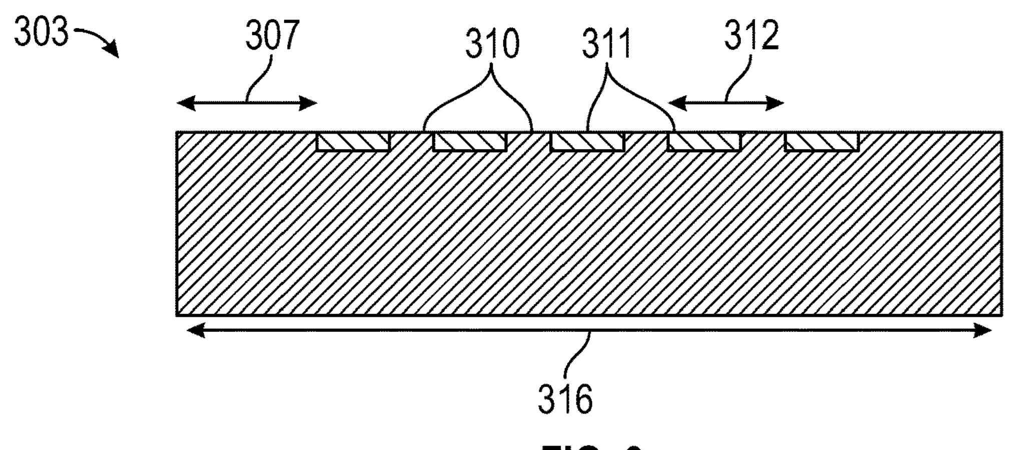
FIG. 3 illustrates an example embodiment of a singulated element that can employ a reduced edge exclusion distance.

FIG. 3 illustrates an example embodiment of a singulated element that can employ a reduced an edge exclusion distance and enable dies to be placed close together. A singulated element 303, as seen in FIG. 3, may have a plurality of conductive contacts 311 surrounded by a plurality of non-conductive regions 310. In some embodiments the plurality of conductive contacts 311 may comprise a conductive material. In some embodiments, the conductive material may comprise silver, gold, indium, nickel or copper or their various alloys. In another embodiment, the conductive material is copper. The singulated element 303 may comprise an edge exclusion distance 307, a pitch 312, and a width 316. The reduced edge exclusion distances 307 can be employed with and have advantages for any die size. Particularly acute advantages are obtained for relatively small dies (e.g., dies having maximum widths less than 8 mm, less than 6 mm, less than 4 mm, less than 3 mm, less than 2 mm), such as chiplets or discrete devices (e.g., passives) with particular functions. FIG. 3 illustrates how smaller edge exclusion zones provide particular proportionate advantages for smaller dies as compared, for example, to the larger exclusion zones of FIGS. 1A-1D. For example, the methods and systems herein can result in an edge exclusion distance of about 50 μm. In one example, a 4 mm×4 mm die can have a 50 μm edge exclusion distance using the methods and systems described herein which results in only about 4.9% of the die area that is unused. In another example, the methods and systems described herein may result in an edge exclusion distance of about 10 μm. In one embodiment, a 1 mm×1 mm die can have a 10 μm edge exclusion distance using the methods and systems described herein which results in only about 4% of the die area that is unused. In another embodiment, the methods and systems described herein may result in an edge exclusion distance of about 5 μm. In one example, a 0.4 mm×0.4 mm die may have a 5 μm edge exclusion distance using the methods and systems described herein which results in only about 5% of the die area that is unused. In some embodiments, a width of the edge exclusion is less than 10 μm, less than 5 μm, or less than 3 μm. In some embodiments, the edge exclusion can be in a range of 0.5 μm to 100 μm, in a range of 0.5 μm to 50 μm, in a range of 0.5 μm to 20 μm, in a range of 0.5 μm to 10 μm, in a range of 1 μm to 10 μm, or in a range of 2 μm to 10 μm. The reduced pitch 312 enabled by hybrid direct bonding techniques (and with dies singulated by ME) facilitates a reduced edge exclusion region 307 as compared to conventional structures. Moreover, as shown in FIGS. 4A-4K, the reduced edge exclusion region 307 can allow components to be directly bonded next to one another and spaced apart by a very small gap. Beneficially, providing dies closely together can allow for effective die stitching in which closely-spaced dies are electrically connected through the carrier with reduced latency and low electrical losses. In some embodiments, the ratio of the edge exclusion distance to the pitch is between 10 and 50. In some embodiments, the ratio of the edge exclusion distance to the pitch is less than 50, less than 15, less than 10, less than 5, or less than 2. In some embodiments, a width of the edge exclusion 307 is comparable to or less than the pitch of adjacent conductive features 311 adjacent to the edge of the die.

Figure 4A:
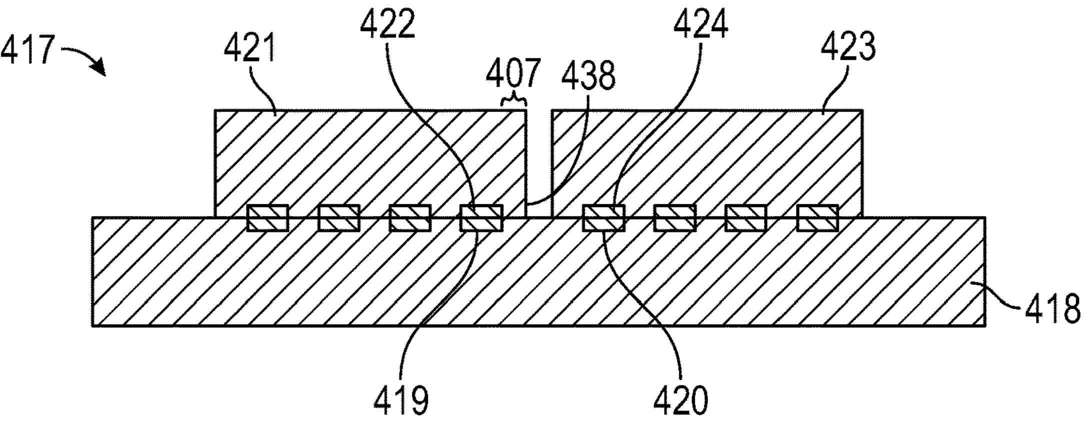

FIGS. 4A-4H show various embodiments of bonded structures. As seen in FIG. 4A a bonded structure 417 can include a carrier 418 including a first conductive contact 419 and a second conductive contact 420. In some embodiments, the carrier 418 can be a substrate (e.g., a wafer, a package, a flat panel, or a temporary substrate comprising a redistribution layer) or a die. In some embodiments, the carrier 418 can comprise a bonding layer 409 (as seen in FIG. 4K). The bonding layer may comprise a dielectric material with at least partially embedded conductive contact features. In some embodiments, the first conductive contact 419 and the second conductive contact 420 may be electrically connected (as seen in FIG. 4K). The bonded structure 417 can include a first singulated element 421 including a third conductive contact 422 directly bonded to the first conductive contact 419 without an adhesive. The bonded structure can also include a second singulated element 423 including a fourth conductive contact 424 directly bonded to the second conductive contact 420 without an adhesive. In some embodiments, the bonded element 421 or 423 (or both) may comprise a singulated package. The singulated package may comprise of one or more dies at least partially embedded in an encapsulating material. In some embodiments, the conductive contacts are made of a conductive material. In some embodiments, the conductive material comprises gold, silver, indium, copper or nickel or their various alloys. In some embodiments, the conductive material is copper. An edge exclusion distance 407 between an outer edge 438 of the first singulated element 421 and the third conductive contact 422 can be less than 100 μm, for example, no more than 50 μm, or no more than 10 μm (e.g., in a range of 1 μm to 100 μm). In some embodiments, the first and second singulated elements comprise dies of a size 10 mm×10 mm or smaller.

Figure 4B:
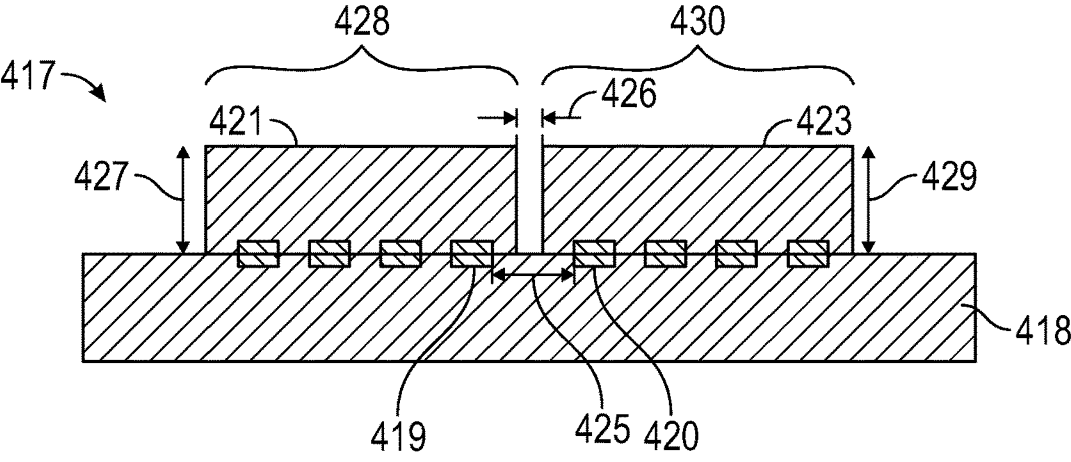

As seen in FIG. 4B, the first singulated element 421 can comprise a thickness 427 and a lateral width 428. In some embodiments, the first singulated element 421 has a maximum lateral width 428 of no more than about 8 mm, no more than about 6 mm, no more than about 4 mm, no more than about 3 mm, or no more than about 2 mm. The second singulated element 423 can comprise a thickness 429 and a width 430. In some embodiments, the second singulated element 423 has a maximum lateral width 430 of no more than about 8 mm, no more than about 6 mm, no more than about 4 mm, no more than about 3 mm, or no more than about 2 mm. The first conductive contact 419 and the second conductive contact 420 can be spaced apart by a contact spacing 425 of no more than 250 microns. In various embodiments, the contact spacing 425 is no more than 200 microns, no more than 100 microns, no more than 50 microns, no more than 10 microns, no more than 5 microns, or no more than 2 microns. For example, in various embodiments, the contact spacing 425 can be in a range of 1 micron to 250 microns, or in a range of 1 micron to 100 microns, or in a range or 1 micron to 20 microns. In some embodiments, the contact spacing 425 is between 0.4 times and 8 times the thickness 427 of the first singulated element 421. In some embodiments, the contact spacing 425 is no more than the thickness 427 of the first singulated element 421. In some embodiments, the contact spacing 425 is between 0.4 times and 8 times the thickness 429 of the second singulated element 423. In some embodiments, the contact spacing 425 is no more than the thickness 429 of the second singulated element 423. In some embodiments, the first singulated element 421 and second singulated element 423 can be spaced apart by an element spacing 426 of about 5 μm (microns) to about 60 μm, for example less than about 25 μm. In some embodiments, the element spacing 426 can be no more than 60 μm, no more than 20 μm, no more than 10 μm, no more than 9 μm, no more than 8 μm, or no more than 5 μm. In some embodiments, the element spacing 426 can be in a range of 1 μm to 25 μm, in a range of 1 μm to 15 μm, in a range of 1 μm to 10 μm, in a range of 1 μm to 8 μm, or in a range of 1 μm to 5 μm. In some embodiments, the ratio of the maximum lateral width 428 of the first singulated element 421 to the edge exclusion distance 407 is between 100 and 10 or is less than 50, less than 10, or less than 5, or less than 2. In some embodiments, the ratio of the maximum lateral width 430 of the second singulated element 423 to the edge exclusion distance 407 is between 100 and 10 or is less than 50, less than 10, or less than 5, or less than 2. In some embodiments, the element spacing 426 can be comparable to or less than to the edge exclusion distance 407.

Figure 4C:
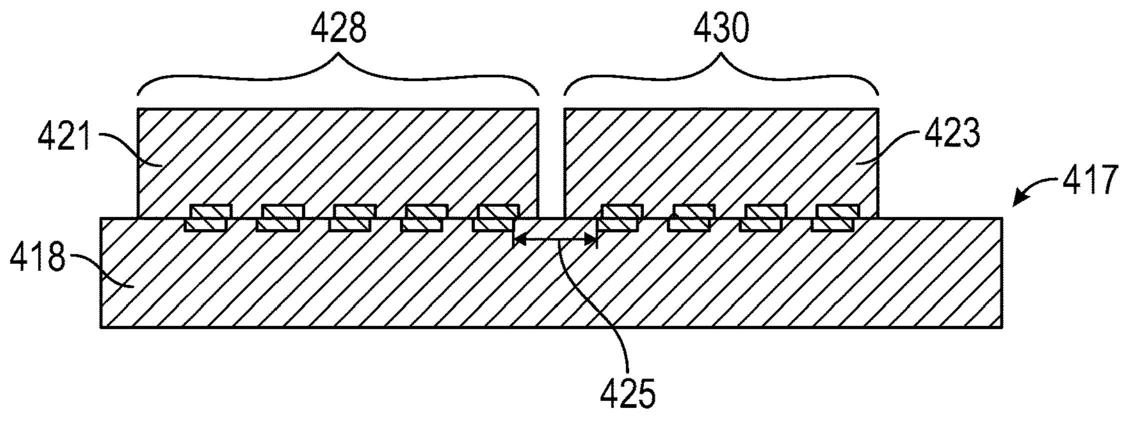
Figure 4D:
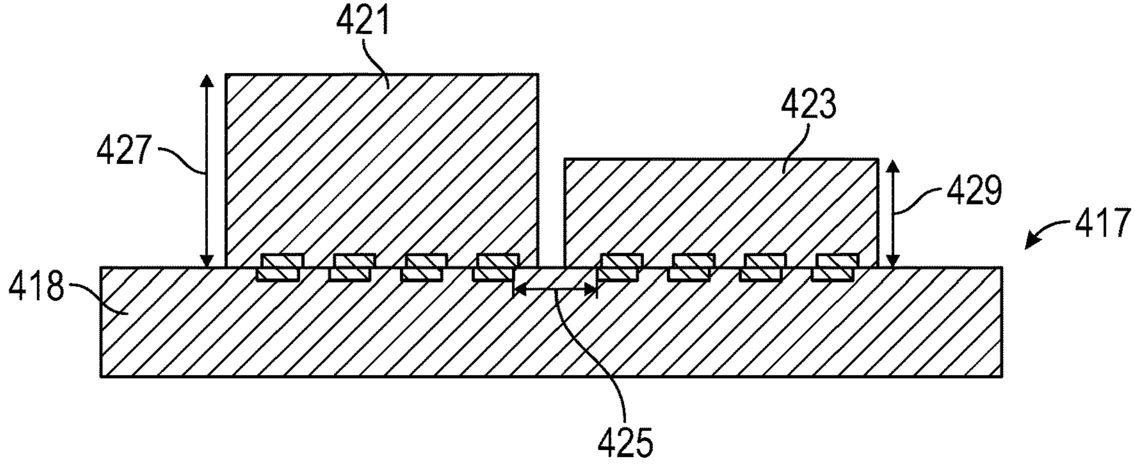

As seen in FIG. 4C, the width 428 of the first singulated element 421 can be longer than the width 430 of the second singulated element 423. As seen in FIG. 4D, the thickness 427 of the first singulated element 421 can be longer than the thickness 429 of the second singulated element 423. In various embodiments, as shown in FIGS. 4B, the contact spacing 425 can be no more than eight times a thickness (427 or 429) of at least one of the first singulated element 421 and second singulated element 423, or can be no more than twice a thickness (427 or 429) of at least one of the first singulated element 421 and second singulated element 423, or can be no more than a thickness (427 or 429) of at least one of the first singulated element 421 and second singulated element 423, or can be no more than 0.4 times a thickness (427 or 429) of at least one of the first singulated element 421 and second singulated element 423, or can be no more than a height of through substrate vias (TSVs) through the thickness of an element.

Figure 4E:
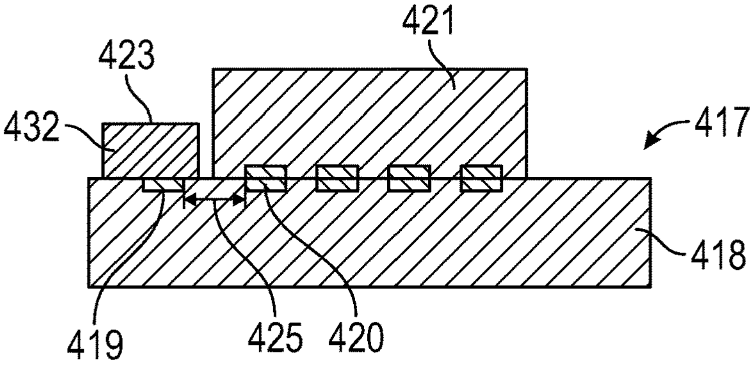

In the illustrated embodiments, the third conductive contact 422 can comprise an electrically active contact electrically connected to circuitry of the first singulated element 421. For example, the third conductive contact 422 can be connected to a signal line, a power line, or electrical ground. In any of the embodiments described herein, any of the conductive contacts may be connected to a signal line, a power line, or electrical ground. In various embodiments, at least one of the first singulated element 421 and the second singulated element 423 comprises an integrated device die having active circuitry. In various embodiments, the laterally outermost pads on a die may comprise active pads connected to a signal, power, or ground, as opposed to dummy pads. In some embodiments, as shown in FIG. 4E, for example, the first singulated element 421 comprises an integrated device die having active circuitry and the second singulated element 423 comprises a passive component 432. As explained herein, at least one of the first and second singulated elements are singulated, in full or in part, using a reactive ion etching (ME) technique for clean and sharp die edges.

As noted, the advantages of closer spacing between elements (dies, electrical components) and more particularly between active contacts of adjacent elements can apply to any sized elements. In some embodiments, relatively small elements (chiplets, component devices) are laterally spaced closely and bonded to a common carrier, where at least one of the overlying elements has a maximum lateral width of no more than about 8 mm, no more than about 6 mm, no more than about 4 mm, no more than about 3 mm, or no more than about 2 mm, although the principles and advantages taught herein are by no means limited to such small elements. In various embodiments, an edge exclusion distance 407 between an outer edge 438 of the first singulated element 421 and the third conductive contact 422 can be less than 100 μm, for example, no more than 50 μm, or no more than 10 μm (e.g., in a range of 1 μm to 100 μm). In some embodiments, the ratio of the maximum lateral width to the edge exclusion distance is between 10 and 100. In some embodiments, the ratio of the maximum lateral width to the edge exclusion distance may be less than 100, less than 50, less than 25, less than 10, less than 5, or less than 2.

Figure 4F:
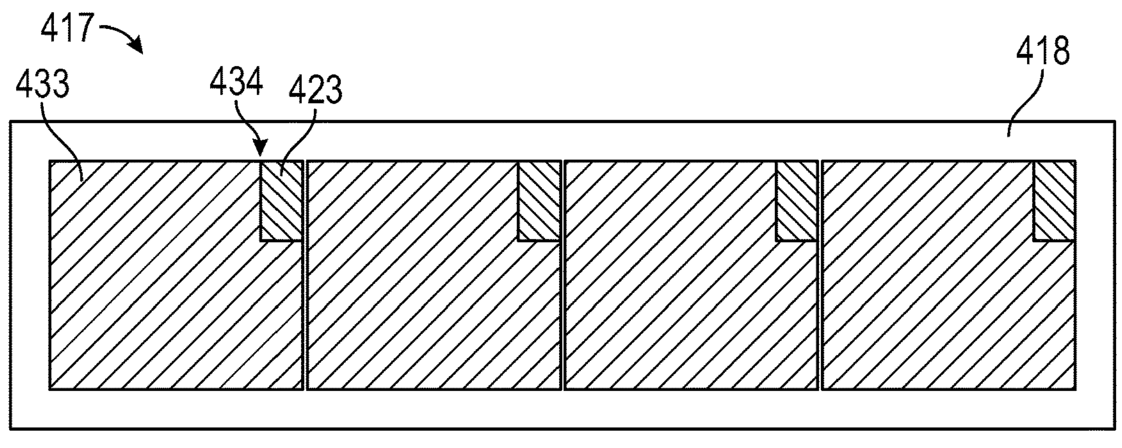

In some embodiments, as shown in the top plan view of FIG. 4F, a bonded structure 417 can include a carrier 418 and a first element 433 directly bonded to the carrier 418 without an adhesive. As shown in FIG. 4F, the first element 433 can include a cutout region 434. A second singulated element 423 can be directly bonded to the carrier 418 without an adhesive. The second singulated element 423 can be disposed at least partially laterally within the cutout region 434 of the first element 433. The use of the cutout region 434 can enable the bonding of small dies, chiplets or components (e.g., passive components such as inductors, capacitors, resistors) having different shapes and in close proximity to adjacent dies. In some embodiments, a third singulated element (not shown) can be directly bonded to the carrier 418 without an adhesive, with the second singulated element 423 disposed between the first element 433 and the third singulated element (not shown).

Figure 4G:
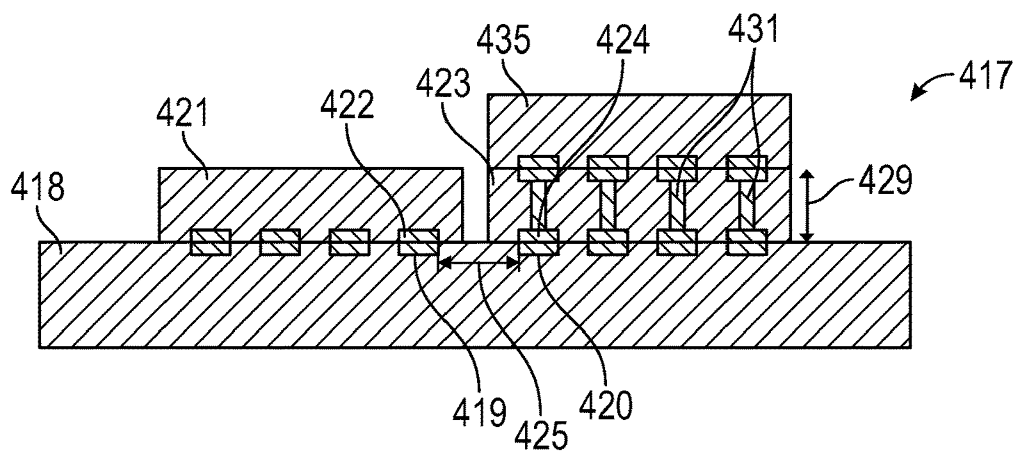

In some embodiments, as shown in FIG. 4G, a third singulated element 435 can be directly bonded to the second singulated element 423. In some embodiments, the third singulated element 435 is directly bonded to the second singulated element 423 without an adhesive. A conductive via or TSV 431 can extend through the second singulated element 423 to connect to the third singulated element 435. In FIG. 4G, the contact spacing 425 between closest active dies of adjacent elements can be no more than about four times (4×) a length (or height) of the conductive via 431. In other embodiments, the contact spacing 425 may less than about 2× or less than about lx the length of the conductive via 431. As will be understood, the length of a conductive through via (TSV) 431 is typically about equal to the thickness 429 of the element. In some embodiments, the via 431 may comprise a thermal via, passive via or element and the length of the via (TSV) 431 can be less than the thickness 429 of the element.

Figure 4H:
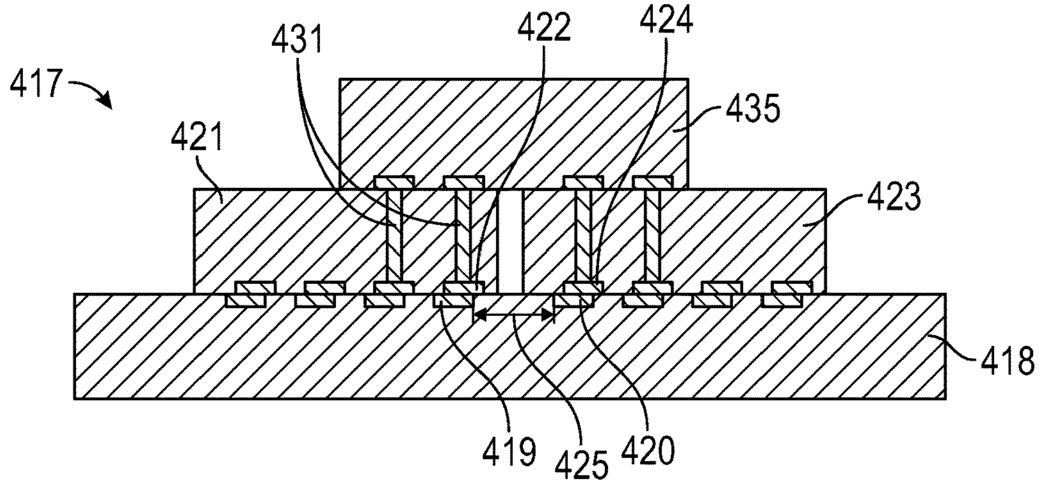

In some embodiments, as seen in FIG. 4H, a third singulated element 435 can be directly bonded to the first singulated element 421 and the second singulated element 423. In some embodiments, the third singulated element 435 is directly bonded to the first singulated element 421 and the second singulated element 423 without an adhesive. In some embodiments, the third singulated element 435 may comprise a singulated package. The singulated package may comprise one or more embedded dies at least partially embedded in an encapsulating material. In some embodiments, third singulated element 435 may comprise a singulated passive elements having a redistribution layer. The planar surface of the redistribution layer may be prepared for hybrid bonding. In some embodiments, the third singulated element 435 may comprise a singulated dielectric element having a redistribution layer. Conductive vias 431 can extend through the first singulated element 421 and the second singulated element 423 to connect to the third singulated element 435. The third singulated element 435 effectively acts as a bridge connecting the first singulated element 421 and second singulated element 423 (and/or connected to the underlying carrier 418). In some embodiments, a layer of dielectric material 439 (as described in conjunction with FIGS. 4I and 4J below) may be deposited on the first singulated element 421, the second singulated element 423, and the carrier 418 prior to the third singulated element 435 being bonded to the first singulated element 421 and second singulated element 423 (as seen in FIG. 4H) or prior to the third singulated element 435 being bonded to the second singulated element 423 (as seen in FIG. 4G). In some embodiments, the layer of dielectric material 439 may form a bonding layer 409 between the third singulated element 435 and the elements to which it is bonded. In some embodiments, the bonding layer 409 may comprise a dielectric material with at least partially embedded conductive contact features (such as contacts 419, 420).

Figure 4I:
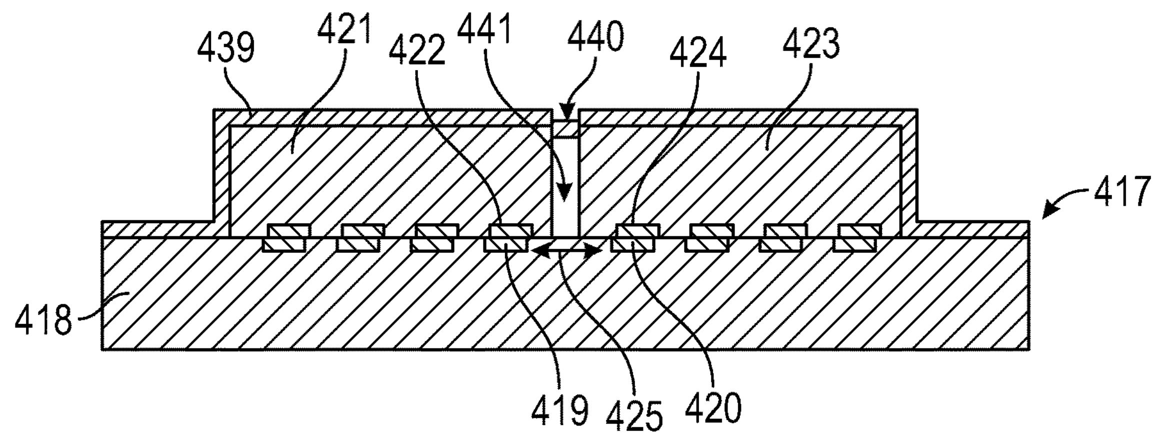
Figure 4J:
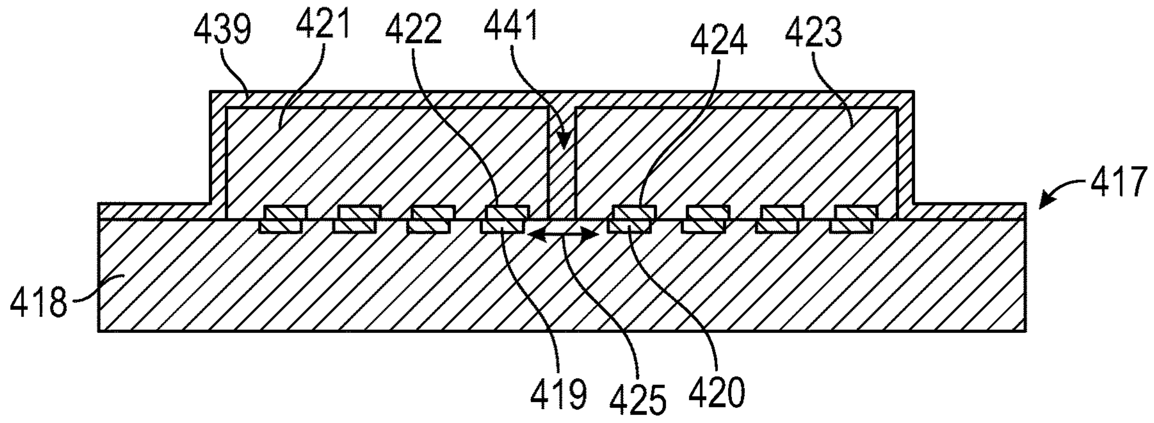
Figures 2, 4J:
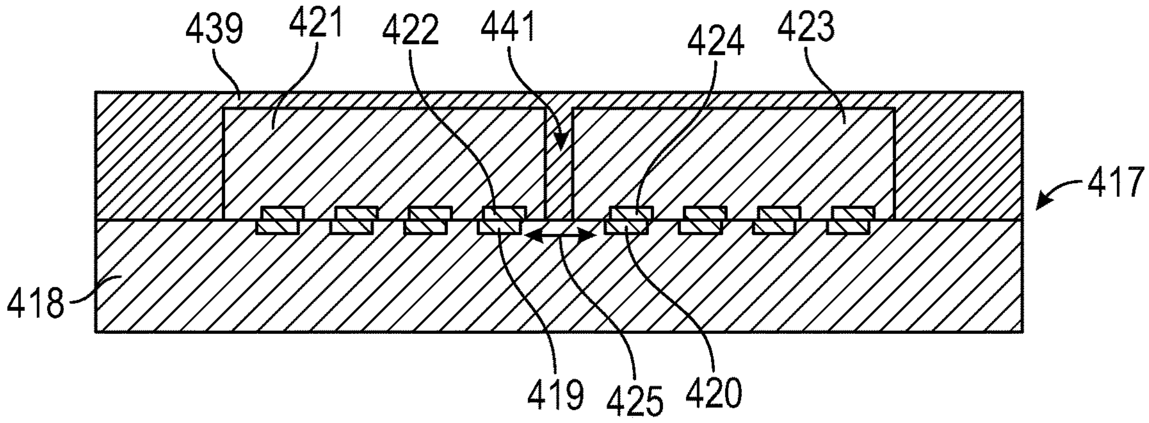

In some embodiments, as seen in FIGS. 4I-4J-2, a layer of dielectric 439 can be deposited over the bonded structure 417. As seen in FIG. 4I, a conformal coating of dielectric material 439 is deposited on the bonding structure 417. In some embodiments, the dielectric layer 439 may cover the carrier 418, the first singulated element 421, and the second singulated element 423. Additionally, the dielectric layer 439 may be placed over the bonding structure 417 such that a small amount 440 of the dielectric material 439 is disposed within the gap 441 between the first singulated element 421 and second singulated element 423. In some embodiments, as seen in FIG. 4I, the small amount 440 of dielectric 439 only extends a short distance into the gap 441. In some embodiments, as seen in FIG. 4J, the dielectric layer 439 may be deposited on the bonding structure 417 such that the gap 441 between the first singulated element 421 and the second singulated element 423 is completely filled (or mostly filled) with the dielectric layer 439. In some embodiments, as seen in FIG. 4J-2, the dielectric layer 439 may be deposited on the carrier 418 such that the dielectric layer 439 on the carrier 418 is of a thickness of about the thickness of one of the singulated elements. In the illustrated embodiment, the dielectric layer 439 is illustrated as extending above the singulated element 421, 423. In other embodiments, the dielectric layer 439 can be planarized (e.g., using a CMP process) such that the top of the dielectric layer 439 is substantially flush with the element 421, 423. In the embodiments of FIGS. 4I-4J-2, the dielectric layer 439 can be prepared for hybrid bonding, and additional element(s) can be directly bonded to the dielectric layer 439. In some embodiments, conductive contacts can be formed in the dielectric layer 439, and the upper surface can be prepared for direct hybrid bonding. One or more additional elements can be directly hybrid bonded to the hybrid bonding layer including the dielectric layer 439. Accordingly, in various embodiments, the elements 421, 423 (such as those shown in FIG. 4J-2) can be formed in a reconstituted element or wafer, and additional elements can be directly bonded to the reconstituted element or wafer. The dielectric layer 439 can comprise an inorganic dielectric material (such as silicon oxide, silicon nitride, silicon oxycarbonitride, etc.) to protect the dies and/or carrier. In other embodiments, the dielectric layer 439 can comprise an organic dielectric material (such as a molding material). In various embodiments, the dielectric layer 439 can comprise multiple layers.

In some embodiments, as seen in FIG. 4K, the carrier 418 may comprise a bonding layer 409. In some embodiments, the bonding layer 409 may comprise a dielectric material with at least partially embedded conductive contact features (such as contacts 419, 420). Although not separately shown, the dies 421, 423 can also include a nonconductive or dielectric bonding layer in which the contacts 422, 424 are at least partially embedded. In some embodiments, the first conductive contact 419 and the first conductive contact 420 may be electrically connected through a connector 442, such as a conductive trace at least partially embedded (e.g., fully embedded) in the bonding layer 409. In some embodiments, the connector 442 may be configured similarly to the conductive through vias (TSV) as described above in conjunction with the other embodiments.

Any of the embodiments described herein, may incorporate the features of any of the other embodiments described herein. For example, the embodiment as seen in FIG. 4A may further comprise a connector 442 as seen in FIG. 4K.

In an embodiment, a bonded structure can include a first singulated element comprising a first conductive contact, and a carrier comprising a second conductive contact. The first conductive contact and the second conductive contact can be directly bonded to one another without an intervening adhesive. The first conductive contact can be spaced apart from an outer edge of the first singulated element by an edge exclusion distance of no more than 100 μm. The first conductive contact can comprise an electrically active contact electrically connected to circuitry of the first singulated element. In various embodiments, the edge exclusion distance can be no more than 50 μm, or no more than 10 μm. For example, the edge exclusion distance can be in a range of 1 μm to 100 μm.

In an embodiment, a bonded structure can include a first singulated element having a first plurality of conductive contacts spaced at a pitch. The first plurality of conductive contacts can include at least one outer conductive contact closest to an outer side edge of the first singulated element. The at least one outer conductive contact can be spaced from the outer side edge by an edge exclusion distance and can comprise an electrically active contact electrically connected to circuitry of the first singulated element. The bonded structure can include a carrier comprising a second plurality of conductive contacts directly bonded to the first plurality of conductive contacts without an intervening adhesive.

In some embodiments, a ratio of the edge exclusion distance to the pitch between the contact pad of at least one element can be less than 15:1. In some embodiments, the ratio of the edge exclusion distance to the pitch of a group of pads adjacent to the exclusion zone can be less than 10:1, less than 5:1, or less than 2:1. In some embodiments, a ratio of a maximum lateral width of the first singulated element to the edge exclusion distance can be more than 15:1, more than 10:1, more than 5:1, or more than 2:1.

In various embodiments, a bonded structure can include a carrier having first bonding surface including a first nonconductive region and a first plurality of conductive contacts; and a singulated device die having a second bonding surface including a second nonconductive region and a second plurality of conductive contacts. The second nonconductive region can be directly bonded to the first nonconductive region of the carrier without an adhesive and the second plurality of conductive contacts can be directly bonded to the first plurality of conductive contacts without an adhesive. The singulated device die can include an etched outer side edge extending non-parallel relative to the second bonding surface and the second plurality of conductive contacts can include at least one outer conductive contact closest to the outer side edge. The at least one outer conductive contact can comprise an electrically active contact electrically connected to circuitry of the singulated device die.

In some embodiments, an integrated device die can include active circuitry, a bonding surface configured for direct hybrid bonding to another element, and an outer edge extending non-parallel relative to the bonding surface. A first conductive contact can be spaced apart from the outer edge by an edge exclusion distance of no more than 100 μm. The first conductive contact can comprise an electrically active contact electrically connected to the active circuitry. In some embodiments, the edge exclusion distance is no more than 50 μm. In some embodiments, the first conductive contact is electrically connected to a signal line, a power line, or electrical ground. In some embodiments, one or more dummy pads may be disposed in the exclusion zone between the first active conductive contact and an outer edge of the die. In some arrangements, the dummy pad(s) may have smaller maximum lateral dimensions than the first active conductive contact.

In any of the above embodiments, any of the singulated elements can include an etched outer side which extends non-parallel relative to bonding surface of the singulated die. In some embodiments, the etched outer side extends perpendicular to the bonding surface of the singulated die. In some embodiments, the etched outer side extends at an 85°-90° angle relative to the bonding surface of the singulated die.

In various embodiments, a bonded structure can include a carrier including a first conductive contact and a second conductive contact, a first singulated element including a third conductive contact directly bonded to the first conductive contact without an adhesive, and a second singulated element including a fourth conductive contact directly bonded to the second conductive contact without an adhesive. In some embodiments, the first and second conductive contacts are spaced apart by a contact spacing of no more than 250 microns.

In some embodiments, the first and second singulated elements are spaced apart by an element spacing of no more than 10 microns. In some embodiments, the first and second conductive contacts are spaced apart by a contact spacing of between about 0.4 times and 8 times a thickness of at least one of the first and second singulated elements. In some embodiments, the bonded structure can include a carrier and a first and second singulated elements that are direct hybrid bonded. In another embodiment, the contact spacing is less than about 2 times the thickness of at least one of the first and second singulated elements. In one embodiment, the first and second singulated elements included respective nonconductive regions directly bonded to corresponding nonconductive region(s) of the carrier without an adhesive. In some embodiments, the contact spacing is no more than 200 microns. In some embodiments, the contact spacing is no more than 100 microns. In some embodiments, the contact spacing is no more than 50 microns. In some embodiments, contact spacing is no more than 10 microns. In some embodiments, the contact spacing is no more than 5 microns.

In some embodiments, the contact spacing is no more than 2 microns. In some embodiments, the contact spacing is in a range of 1 micron to 250 microns. In some embodiments, the contact spacing is in a range of 1 micron to 100 microns. In some embodiments, the contact spacing is in a range of 1 micron to 20 microns. In some embodiments, the element spacing is no more than 20 microns. In some embodiments, the element spacing is no more than 10 microns. In some embodiments, the contact spacing is no more than the thickness of at least one of the first and second singulated elements.

In various embodiments, a bonded structure can include a carrier including a first conductive contact and a second conductive contact, a first singulated element including a third conductive contact directly bonded to the first conductive contact without an adhesive, and a second singulated element including a fourth conductive contact directly bonded to the second conductive contact without an adhesive. In some embodiments, the third conductive contact comprises an electrically active contact electrically connected to circuitry of the first singulated element. In some embodiments, the third conductive contact is connected to a signal line, a power line, or electrical ground. In some embodiments, the at least one of the first and second singulated elements comprise an integrated device die having active circuitry. In some embodiments, the first singulated element comprises an integrated device die having active circuitry and the second singulated element comprises a passive component. In some embodiments, at least one of the first and second singulated elements are singulated with a reactive ion etching (ME) process. In some embodiments, a maximum lateral width of at least one of the first and second singulated elements is no more than 4 mm. In some embodiments, a maximum lateral width of at least one of the first and second singulated elements is no more than 2 mm. In some embodiments, an edge exclusion distance between an outer edge of the first singulated element and the third conductive contact is less than 100 microns. In some embodiments, the edge exclusion distance is no more than 50 microns. In some embodiments, the edge exclusion distance is no more than 10 microns. In some embodiments, the edge exclusion distance is in a range of 1 micron to 100 microns.

In various embodiments, a bonded structure can include a carrier, a first element directly bonded to the carrier without an adhesive, the first element including a cutout region, and a second singulated element directly bonded to the carrier without an adhesive, the second singulated element disposed at least partially laterally within the cutout region of the first element. In some embodiments, the bonded structure further comprises a third singulated element directly bonded to the carrier without an adhesive, the second singulated element disposed between the first element and the third singulated element. In some embodiments, a third element is directly bonded to the second singulated element. In some embodiments, the bonded structure comprises a conductive via through the second singulated element to connect to the third element. In some embodiments, the contact spacing is no more than a length of the conductive via.

In various embodiments, a bonded structure can include a first singulated element comprising a first conductive contact and a carrier comprising a second contact pad. In some embodiments, the first conductive contact and the second conductive contact are directly bonded to one another without an intervening adhesive. The first conductive contact can be spaced apart from an outer edge of the first singulated element by an edge exclusion distance of no more than 200 microns. In some embodiments, the first conductive contact comprises an electrically active contact electrically connected to circuitry of the first singulated element. In some embodiments, the edge exclusion distance is between about 10 microns and 100 microns.

In various embodiments, a bonded structure can include a first singulated element having a first plurality of conductive contacts spaced at a pitch. The first plurality of conductive contacts can include at least one outer conductive contact closest to an outer side edge of the first singulated element. In some embodiments the at least one outer conductive contact is spaced from the outer side edge by an edge exclusion distance and comprises an electrically active contact electrically connected to circuitry of the first singulated element and a carrier which comprises a second plurality of conductive contacts directly bonded to the first plurality of conductive contacts without an intervening adhesive. In some embodiments, the ratio of the edge exclusion distance to the pitch is between about 10:1 and 50:1. In some embodiments, the ratio of the edge exclusion distance to the pitch is less than about 15:1.

In another embodiment, a bonded structure can include a first singulated element having a maximum lateral width and include a first plurality of conductive contacts. In some embodiments, the first plurality of conductive contacts includes at least one outer conductive contact closest to an outer side edge of the first singulated element. In some embodiments, the at least one outer conductive contact is spaced from the outer side edge by an edge exclusion distance and comprises an electrically active contact electrically connected to circuitry of the first singulated element; In some embodiments, the bonded structure can include a carrier which comprises a second plurality of conductive contacts directly bonded to the first plurality of conductive contacts without an intervening adhesive. In some embodiments, the ratio of the maximum lateral width to the edge exclusion distance is between about 10:1 and 100:1. In some embodiments, the ratio of the maximum lateral width to the exclusion distance is less than about 50:1.

In another embodiment, a bonded structure can include a carrier having first bonding surface which includes a first nonconductive region and a first plurality of conductive contacts. In some embodiments, the bonded structure includes a singulated device die having a second bonding surface including a second nonconductive region and a second plurality of conductive contacts. In some embodiments, the second nonconductive region is directly bonded to the first nonconductive region of the carrier without an adhesive and the second plurality of conductive contacts is directly bonded to the first plurality of conductive contacts without an adhesive. In some embodiments, the singulated device die includes an etched outer side edge extending non-parallel relative to the second bonding surface and the second plurality of conductive contacts includes at least five outer conductive contacts closest to the outer side edge, the at least five outer conductive contacts comprising an electrically active contact electrically connected to circuitry of the singulated device die. In some embodiments, the edge exclusion distance is no more than 50 microns. In some embodiments, the edge exclusion distance is no more than 10 microns. In some embodiments, wherein the edge exclusion distance is in a range of 1 micron to 100 microns. In some embodiments, the ratio of the edge exclusion distance to the pitch is less than 10. In some embodiments, the ratio of the edge exclusion distance to the pitch is less than 5. In some embodiments, the edge exclusion distance to the pitch is less than 2. In some embodiments, the ratio of the maximum lateral width to the edge exclusion distance is less than 10. In some embodiments, the ratio of the maximum lateral width to the edge exclusion distance is less than 5. In some embodiments, the ratio of the maximum lateral width to the edge exclusion distance is less than 2. In some embodiments, the at least one outer conductive contact is electrically connected to a signal line, a power line, or electrical ground.

In various embodiments, an integrated device die can include active circuitry, a bonding surface configured for direct hybrid bonding to another element, an outer edge extending non-parallel relative to the bonding surface, and a first conductive contact spaced apart from the outer edge by an edge exclusion distance of no more than 100 microns. In some embodiments, the first conductive contact comprises an electrically active contact electrically connected to the active circuitry. In some embodiments, the edge exclusion distance is no more than 50 microns. In some embodiments, the first conductive contact is electrically connected to a signal line, a power line, or electrical ground. An integrated comprising a dummy inactive contact disposed between the first conductive contact and the outer edge of the die.

In various embodiments, an integrated device die can include active circuitry, a bonding surface configured for direct hybrid bonding to another element, an outer edge extending non-parallel relative to the bonding surface, and a first conductive contact spaced apart from the outer edge by an edge exclusion distance of no more than 100 microns. In some embodiments, the first conductive contact comprises an electrically active contact electrically connected to the active circuitry. In some embodiments, the edge exclusion distance is no more than 50 microns. In some embodiments, the first conductive contact is electrically connected to a signal line, a power line, or electrical ground. An integrated comprising a dummy inactive contact disposed between the first conductive contact and the outer edge of the die.

In various embodiments, a method for singulating dies includes planarizing a substrate, wherein the substrate comprises a plurality of conductive contacts, applying a protective layer on the substrate, patterning the protective layer on the substrate, transferring the substrate to a dicing frame, and singulating the substrate, via an etching process, into a plurality of singulated elements. In some embodiments, the etching process comprises a dry etching process, a wet etching process, or a fine dicing blade. In some embodiments, the dry etching process is reactive ion etching. In some embodiments, singulating the substrate is accomplished through a combination of etching processes.

In various embodiments, the method for singulating dies can further comprise removing the protective layer from the substrate, processing the substrate with a treatment method, and preparing the substrate for direct bonding to another element. In some embodiments, the treatment method comprises ashing, surface activation or nitrogen plasma treatment. In some embodiments, preparing the substate for direct bonding further comprises cleaning, rinsing, and drying the substate.

In various embodiments, a method for creating a bonded structure can include singulating a first and second elements, wherein the first and second element comprise an edge exclusion distance of no more than 100 microns, and bonding the first and second singulated elements to a carrier, wherein the distance between the first and second singulated elements is no more than 10 microns. In some embodiments, bonding the first and second singulated elements to a carrier comprises directly bonding the first and second singulated elements to the carrier without the use of an adhesive. In some embodiments, singulating a first and second elements, comprises singulating the first and second elements using reactive ion etching.

The skilled artisan will appreciate that features of the above-reference embodiments can be informed, without limitation, by the additional disclosures provided in U.S. Provisional Application No. 63/313,639, the entire contents of which are incorporated by reference herein in its entirety and for all purposes. Examples of Direct Bonding Methods and Directly Bonded Structures Various embodiments disclosed herein relate to directly bonded structures in which two or more elements can be directly bonded to one another without an intervening adhesive. FIGS. 5A and 5B schematically illustrate a process for forming a directly hybrid bonded structure without an intervening adhesive according to some embodiments. In FIGS. 5A and 5B, a bonded structure 517 comprises two elements 543 and 544 that can be directly bonded to one another at a bond interface 545 without an intervening adhesive. Two or more microelectronic elements 543 and 544 (such as semiconductor elements, including, for example, integrated device dies, wafers, passive devices, individual active devices such as power switches, etc.) may be stacked on or bonded to one another to form the bonded structure 517. Conductive features 546*a* (e.g., contact pads, traces, exposed ends of vias through substrate electrodes or vias) of a first element 543 may be electrically connected to corresponding conductive features 546*b* of a second element 544. Any suitable number of elements can be stacked in the bonded structure 517. For example, a third element (not shown) can be stacked on the second element 544, a fourth element (not shown) can be stacked on the third element, and so forth. Additionally or alternatively, one or more additional elements (not shown) can be stacked laterally adjacent one another along the first element 543. In some embodiments, the laterally stacked additional element may be smaller than the second element. In some embodiments, the laterally stacked additional element may be two times smaller than the second element.

In some embodiments, the elements 543 and 544 are directly bonded to one another without an adhesive. In various embodiments, a non-conductive field region that includes a non-conductive or dielectric material can serve as a first bonding layer 509*a* of the first element 543 which can be directly bonded to a corresponding non-conductive field region that includes a non-conductive or dielectric material serving as a second bonding layer 509*b* of the second element 104 without an adhesive. The non-conductive bonding layers 509*a* and 509*b* can be disposed on respective front sides 547*a* and 547*b* of device portions 548*a* and 548*b*, such as a semiconductor (e.g., silicon) portion of the elements 543, 544, or back-end-of-line (BEOL) interconnect layers over such semiconductor portions. Active devices and/or circuitry can be patterned and/or otherwise disposed in or on the device portions 548*a* and 548*b*. Active devices and/or circuitry can be disposed at or near the front sides 547*a* and 547*b* of the device portions 548*a* and 548*b*, and/or at or near opposite backsides 549*a* and 549*b* of the device portions 548*a* and 548*b*. Bonding layers can be provided on front sides and/or back sides of the elements. The non-conductive material can be referred to as a non-conductive bonding region or bonding layer 509*a* of the first element 543. In some embodiments, the non-conductive bonding layer 509*a* of the first element 543 can be directly bonded to the corresponding non-conductive bonding layer 509*b* of the second element 544 using dielectric-to-dielectric bonding techniques. For example, non-conductive or dielectric-to-dielectric bonds may be formed without an adhesive using the direct bonding techniques disclosed at least in U.S. Pat. Nos. 9,564,414; 9,391,143; and 10,434,749, the entire contents of each of which are incorporated by reference herein in their entirety and for all purposes. It should be appreciated that in various embodiments, the bonding layers 509*a* and/or 509*b* can comprise a non-conductive material such as a dielectric material, such as silicon oxide, or an undoped semiconductor material, such as undoped silicon. Suitable dielectric bonding surface or materials for direct bonding include but are not limited to inorganic dielectrics including silicon, such as silicon oxide, silicon nitride, or silicon oxynitride, or can include carbon, such as silicon carbide, silicon oxycarbonitride, low K dielectric materials, SiCOH dielectrics, silicon carbonitride or diamond-like carbon or a material comprising a diamond surface. Such carbon-containing ceramic materials can be considered inorganic, despite the inclusion of carbon. In some embodiments, the dielectric materials do not comprise polymer materials, such as epoxy, resin or molding materials.

In some embodiments, the device portions 548*a* and 548*b* can have a significantly different coefficients of thermal expansion (CTEs) defining a heterogenous structure. The CTE difference between the device portions 548*a* and 548*b*, and particularly between bulk semiconductor, typically single crystal portions of the device portions 548*a*, 548*b*, can be greater than 5 ppm or greater than 10 ppm. For example, the CTE difference between the device portions 548*a* and 548*b* can be in a range of 5 ppm to 100 ppm, 5 ppm to 40 ppm, 10 ppm to 100 ppm, or 10 ppm to 40 ppm. In some embodiments, one of the device portions 548*a* and 548*b* can comprise optoelectronic single crystal materials, including perovskite materials, that are useful for optical piezoelectric or pyroelectric applications, and the other of the device portions 548*a,* 548*b* comprises a more conventional substrate material. For example, one of the device portions 548*a,* 548*b* comprises lithium tantalate ($LiTaO3$) or lithium niobate ($LiNbO3$), and the other one of the device portions 548*a,* 548*b* comprises silicon (Si), quartz, fused silica glass, sapphire, or a glass. In other embodiments, one of the device portions 548*a* and 548*b* comprises a III-V single semiconductor material, such as gallium arsenide (GaAs) or gallium nitride (GaN), and the other one of the device portions 548*a* and 548*b* can comprise a non-III-V semiconductor material, such as silicon (Si), or can comprise other materials with similar CTE, such as quartz, fused silica glass, sapphire, or a glass.

In various embodiments, direct hybrid bonds can be formed without an intervening adhesive. For example, non-conductive bonding surfaces 550*a* and 550*b* can be polished to a high degree of smoothness. The nonconductive bonding surfaces 550*a* and 550*b* can be polished using, for example, chemical mechanical polishing (CMP). The roughness of the polished bonding surfaces 550*a* and 550*b* can be less than 30 Å rms. For example, the roughness of the bonding surfaces 550*a* and 550*b* can be in a range of about 0.1 Å rms to 15 Å rms, 0.5 Å rms to 10 Å rms, or 1 Å rms to 5 Å rms. The bonding surfaces 550*a* and 550*b* can be cleaned and exposed to a plasma and/or etchants to activate the surfaces 550*a* and 550*b*. In some embodiments, the surfaces 550*a* and 550*b* can be terminated with a species after activation or during activation (e.g., during the plasma and/or etch processes). Without being limited by theory, in some embodiments, the activation process can be performed to break chemical bonds at the bonding surfaces 550*a* and 550*b,* and the termination process can provide additional chemical species at the bonding surfaces 550*a* and 550*b* that improves the bonding energy during direct bonding. In some embodiments, the activation and termination are provided in the same step, e.g., a plasma to activate and terminate the surfaces 550*a* and 550*b*. In other embodiments, the bonding surfaces 550*a* and 550*b* can be terminated in a separate treatment to provide the additional species for direct bonding. In various embodiments, the terminating species can comprise nitrogen. For example, in some embodiments, the bonding surface(s) 550*a,* 550*b* can be exposed to a nitrogen-containing plasma. Further, in some embodiments, the bonding surfaces 550*a* and 550*b* can be exposed to fluorine. For example, there may be one or multiple fluorine peaks at or near a bond interface 545 between the first and second elements 543, 544. Thus, in the directly bonded structure 517, the bond interface 545 between two non-conductive materials (e.g., the bonding layers 509*a* and 509*b*) can comprise a very smooth interface with higher nitrogen content and/or fluorine peaks at the bond interface 545. Additional examples of activation and/or termination treatments may be found throughout U.S. Pat. Nos. 9,564,414; 9,391,143; and 10,434,749, the entire contents of each of which are incorporated by reference herein in their entirety and for all purposes. The roughness of the polished bonding surfaces 550*a* and 550*b* can be slightly rougher (e.g., about 1 Å rms to 30 Å rms, 3 Å rms to 20 Å rms, or possibly rougher) after an activation process.

In various embodiments, conductive features 546*a* of the first element 543 can also be directly bonded to corresponding conductive features 546*b* of the second element 544 without an adhesive (e.g., without solder or other conductive adhesive intervening between the conductive features 546*a,* 546*b*). For example, a direct hybrid bonding technique can be used to provide conductor-to-conductor direct bonds along the bond interface 545 that includes covalently direct bonded non-conductive-to-non-conductive (e.g., dielectric-to-dielectric) surfaces, prepared as described above. In various embodiments, the conductor-to-conductor (e.g., conductive feature 546*a* to conductive feature 546*b*) direct bonds and the dielectric-to-dielectric hybrid bonds can be formed using the direct hybrid bonding techniques disclosed at least in U.S. Pat. Nos. 9,716,033 and 9,852,988, the entire contents of each of which are incorporated by reference herein in their entirety and for all purposes. In direct hybrid bonding embodiments described herein, conductive features are provided within non-conductive bonding layers, and both conductive and nonconductive features are prepared for direct bonding, such as by the planarization, activation and/or termination treatments described above. Thus, the bonding surface prepared for direct hybrid bonding includes both conductive and non-conductive features.

For example, non-conductive (e.g., dielectric) bonding surfaces 550*a,* 550*b* (for example, inorganic dielectric surfaces) can be prepared and directly bonded to one another without an intervening adhesive as explained above. Conductive contact features (e.g., conductive features 546*a* and 546*b* which may be at least partially surrounded by non-conductive dielectric field regions within the bonding layers 509*a,* 509*b*) may also directly bond to one another without an intervening adhesive. In various embodiments, the conductive features 546*a,* 546*b* can comprise discrete pads or traces at least partially embedded in the non-conductive field regions. In some embodiments, the conductive contact features can comprise exposed contact surfaces of through substrate vias (e.g., through silicon vias (TSVs)). In some embodiments, the respective conductive features 546*a* and 546*b* can be recessed below exterior (e.g., upper) surfaces (non-conductive bonding surfaces 550*a* and 550*b*) of the dielectric field region or non-conductive bonding layers 509*a* and 509*b,* for example, recessed by less than 30 nm, less than 20 nm, less than 15 nm, or less than 10 nm, for example, recessed in a range of 2 nm to 20 nm, or in a range of 4 nm to 10 nm. The recess can be at or near the middle or center of the cavity in which the conductive features 546*a,* 546*b* are disposed, and, additionally or alternatively, can extend or be disposed along sides of the cavity in which the conductive features 546*a,* 546*b* are disposed. In various embodiments, prior to direct bonding, the recesses in the opposing elements can be sized such that the total gap between opposing contact pads is less than 15 nm, or less than 10 nm. The non-conductive bonding layers 509*a* and 509*b* can be directly bonded to one another without an adhesive at room temperature in some embodiments and, subsequently, the bonded structure 517 can be annealed. Upon annealing, the conductive features 546*a* and 546*b* can expand and contact one another to form a metal-to-metal direct bond. Beneficially, the use of Direct Bond Interconnect, or DBI®, techniques commercially available from Adeia of San Jose, Calif., can enable high density of conductive features 546*a* and 546*b* to be connected across the direct bond interface 545 (e.g., small or fine pitches for regular arrays). In some embodiments, the pitch of the conductive features 546*a* and 546*b,* such as conductive traces embedded in the bonding surface of one of the bonded elements, may be less than 100 microns or less than 10 microns or even less than 2 microns. For some applications, the ratio of the pitch of the conductive features 546*a* and 546*b* to one of the dimensions (e.g., a diameter) of the bonding pad is less than is less than 20, or less than 10, or less than 5, or less than 3 and sometimes desirably less than 2. In other applications, the width of the conductive traces embedded in the bonding surface of one of the bonded elements may range between 0.3 to 20 microns, e.g., in a range of 0.3 to 3 microns. In various embodiments, the conductive features 546*a* and 546*b* and/or traces can comprise copper or copper alloys, although other metals may be suitable. For example, the conductive features disclosed herein, such as the conductive features 546*a* and 546*b*, can comprise fine-grain metal (e.g., a fine-grain copper).

Thus, in direct bonding processes, a first element 543 can be directly bonded to a second element 544 without an intervening adhesive. In some arrangements, the first element 543 can comprise a singulated element, such as a singulated integrated device die. In other arrangements, the first element 543 can comprise a carrier or substrate (e.g., a wafer) that includes a plurality (e.g., tens, hundreds, or more) of device regions that, when singulated, form a plurality of integrated device dies. Similarly, the second element 544 can comprise a singulated element, such as a singulated integrated device die. In other arrangements, the second element 104 can comprise a carrier or substrate (e.g., a wafer). The embodiments disclosed herein can accordingly apply to wafer-to-wafer (W2W), die-to-die (D2D), or die-to-wafer (D2W) bonding processes. In W2W processes, two or more wafers can be directly bonded to one another (e.g., direct hybrid bonded) and singulated using a suitable singulation process. After singulation, side edges of the singulated structure (e.g., the side edges of the two bonded elements) may be substantially flush and may include markings indicative of the common singulation process for the bonded structure (e.g., saw markings if a saw singulation process is used).

As explained herein, the first and second elements 543 and 544 can be directly bonded to one another without an adhesive, which is different from a deposition process and results in a structurally different interface compared to a deposition. In one application, a width of the first element 543 in the bonded structure is similar to a width of the second element 544. In some other embodiments, a width of the first element 543 in the bonded structure 517 is different from a width of the second element 544. Similarly, the width or area of the larger element in the bonded structure may be at least 10% larger than the width or area of the smaller element. The first and second elements 543 and 544 can accordingly comprise non-deposited elements. Further, directly bonded structures 517, unlike deposited layers, can include a defect region along the bond interface 545 in which nanometer-scale voids (nanovoids) are present. The nanovoids may be formed due to activation of the bonding surfaces 550*a* and 550*b* (e.g., exposure to a plasma). As explained above, the bond interface 545 can include concentration of materials from the activation and/or last chemical treatment processes. For example, in embodiments that utilize a nitrogen plasma for activation, a nitrogen peak can be formed at the bond interface 545. The nitrogen peak can be detectable using secondary ion mass spectroscopy (SIMS) techniques. In various embodiments, for example, a nitrogen termination treatment (e.g., exposing the bonding surface to a nitrogen-containing plasma) can replace OH groups of a hydrolyzed (OH-terminated) surface with NH2 molecules, yielding a nitrogen-terminated surface. In embodiments that utilize an oxygen plasma for activation, an oxygen peak can be formed at the bond interface 545. In some embodiments, the bond interface 545 can comprise silicon oxynitride, silicon oxycarbonitride, or silicon carbonitride. As explained herein, the direct bond can comprise a covalent bond, which is stronger than van Der Waals bonds.

The bonding layers 509*a* and 509*b* can also comprise polished surfaces that are planarized to a high degree of smoothness.

In various embodiments, the metal-to-metal bonds between the conductive features 546*a* and 546*b* can be joined such that metal grains grow into each other across the bond interface 545. In some embodiments, the metal is or includes copper, which can have grains oriented along the 111 crystal plane for improved copper diffusion across the bond interface 545. In some embodiments, the conductive features 546*a* and 546*b* may include nanotwinned copper grain structure, which can aid in merging the conductive features during anneal. The bond interface 545 can extend substantially entirely to at least a portion of the bonded conductive features 546*a* and 546*b*, such that there is substantially no gap between the non-conductive bonding layers 509*a* and 509*b* at or near the bonded conductive features 546*a* and 546*b*. In some embodiments, a barrier layer may be provided under and/or laterally surrounding the conductive features 546*a* and 546*b* (e.g., which may include copper). In other embodiments, however, there may be no barrier layer under the conductive features 546*a* and 546*b*, for example, as described in U.S. Pat. No. 11,195,748, which is incorporated by reference herein in its entirety and for all purposes.

Beneficially, the use of the hybrid bonding techniques described herein can enable extremely fine pitch between adjacent conductive features 546*a* and 546*b*, and/or small pad sizes. For example, in various embodiments, the pitch p (i.e., the distance from edge-to-edge or center-to-center, as shown in FIG. 5A) between adjacent conductive features 546*a* (or 546*b*) can be in a range of 0.5 microns to 50 microns, in a range of 0.75 microns to 25 microns, in a range of 1 micron to 25 microns, in a range of 1 micron to 10 microns, or in a range of 1 micron to 5 microns. Further, a major lateral dimension (e.g., a pad diameter) can be small as well, e.g., in a range of 0.25 microns to 30 microns, in a range of 0.25 microns to 5 microns, or in a range of 0.5 microns to 5 microns.

As described above, the non-conductive bonding layers 509*a*, 509*b* can be directly bonded to one another without an adhesive and, subsequently, the bonded structure 517 can be annealed. Upon annealing, the conductive features 546*a*, 546*b* can expand and contact one another to form a metal-to-metal direct bond. In some embodiments, the materials of the conductive features 546*a*, 546*b* can interdiffuse during the annealing process.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Moreover, as used herein, when a first element is described as being "on" or "over" a second element, the first element may be directly on or over the second element, such that the first and second elements directly contact, or the first element may be indirectly on or over the second element such that one or more elements intervene between the first and second elements. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A bonded structure comprising:

a carrier including a first conductive contact and a second conductive contact;

a first singulated element direct hybrid bonded to the carrier, the first singulated element including a third conductive contact directly bonded to the first conductive contact without an adhesive; and a second singulated element direct hybrid bonded to the carrier, the second singulated element including a fourth conductive contact directly bonded to the second conductive contact without an adhesive, wherein the first and second conductive contacts are spaced apart by a contact spacing of no more than 250 microns.

2. The bonded structure of claim 1, wherein the contact spacing is no more than 100 microns.

3. The bonded structure of claim 1, wherein the contact spacing is no more than 50 microns.

4. The bonded structure of claim 1, wherein the contact spacing is no more than 10 microns.

5. The bonded structure of claim 1, wherein the first and second singulated elements included respective nonconductive regions directly bonded to corresponding nonconductive region(s) of the carrier without an adhesive.

6. A bonded structure comprising:

a carrier including a first conductive contact and a second conductive contact;

a first singulated element direct hybrid bonded to the carrier, the first singulated element including a third conductive contact directly bonded to the first conductive contact without an adhesive; and a second singulated element direct hybrid bonded to the carrier, the second singulated element including a fourth conductive contact directly bonded to the second conductive contact without an adhesive, wherein the first and second singulated elements are spaced apart by an element spacing of no more than 50 microns.

7. The bonded structure of claim 6, wherein the element spacing is no more than 20 microns.

8. The bonded structure of claim 6, wherein the element spacing is no more than 10 microns.

9. The bonded structure of claim 6, wherein the third conductive contact comprises an electrically active contact electrically connected to circuitry of the first singulated element.

10. The bonded structure of claim 9, wherein the third conductive contact is connected to a signal line, a power line, or electrical ground.

11. The bonded structure of claim 6, wherein at least one of the first and second singulated elements comprises an integrated device die having active circuitry.

12. The bonded structure of claim 6, further comprising a third element directly bonded to the second singulated element.

13. The bonded structure of claim 12, further comprising a conductive via through the second singulated element to connect to the third element.

14. A bonded structure comprising:

a carrier;

a first element directly bonded to the carrier without an adhesive, the first element including a cutout region; and a second singulated element directly bonded to the carrier without an adhesive, the second singulated element disposed at least partially laterally within the cutout region of the first element.

15. The bonded structure of claim 14, further comprising a third singulated element directly bonded to the carrier without an adhesive, the second singulated element disposed between the first element and the third singulated element.

16. The bonded structure of claim 15, further comprising a conductive via through the second singulated element to connect to the third element.

17. The bonded structure of claim 16, wherein the contact spacing is no more than a length of the conductive via.

18. The bonded structure of claim 1, wherein the first and second conductive contacts are dummy contacts.

19. The bonded structure of claim 1, wherein the first and second conductive contacts are connected to active circuitry.

* * * * *